(12) United States Patent
Sonoda et al.

(10) Patent No.: US 6,839,365 B1
(45) Date of Patent: Jan. 4, 2005

(54) LIGHT WAVELENGTH CONVERTING SYSTEM

(75) Inventors: Shinichiro Sonoda, Kanagawa (JP); Hideo Miura, Kanagawa (JP); Masami Hatori, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 753 days.

(21) Appl. No.: 09/698,209

(22) Filed: Oct. 30, 2000

(30) Foreign Application Priority Data

| Oct. 28, 1999 | (JP) | 11-307096 |
| Feb. 7, 2000 | (JP) | 2000-029587 |
| Mar. 2, 2000 | (JP) | 2000-57641 |
| Apr. 18, 2000 | (JP) | 2000-117013 |

(51) Int. Cl.[7] ............................................. H01S 3/10
(52) U.S. Cl. .................................... 372/22; 372/64
(58) Field of Search .......................... 372/92, 22, 64

(56) References Cited

U.S. PATENT DOCUMENTS

| 4,872,180 A | * | 10/1989 | Rideout et al. ............... 372/99 |
| 5,185,752 A | * | 2/1993 | Welch et al. .................. 372/22 |
| 5,205,904 A | * | 4/1993 | Yamamoto et al. ........... 216/24 |
| 5,710,847 A | * | 1/1998 | Takano et al. ................. 385/28 |
| 6,122,299 A | * | 9/2000 | DeMars et al. ............... 372/20 |
| 6,236,792 B1 | * | 5/2001 | Fung ........................... 385/115 |
| 6,317,546 B1 | * | 11/2001 | Kasazumi et al. .......... 385/122 |
| 6,389,197 B1 | * | 5/2002 | Iltchenko et al. ............. 385/28 |
| 6,441,970 B2 | * | 8/2002 | Kasazumi et al. .......... 359/738 |
| 2001/0043387 A1 | * | 11/2001 | Lawrence et al. .......... 359/333 |
| 2003/0002839 A1 | * | 1/2003 | Clow et al. .................. 385/136 |
| 2003/0156792 A1 | * | 8/2003 | Lawrence et al. ............ 385/39 |

FOREIGN PATENT DOCUMENTS

| JP | 6-160930 | 6/1994 | ............. G02F/1/37 |
| JP | 6-242458 | 9/1994 | ......... G02F/1/1345 |
| JP | 9-266338 | 10/1997 | ........... H01S/3/094 |
| JP | 10-1661165 | 6/1998 | ............. G02F/1/37 |
| JP | 10-186427 | 7/1998 | ............. G02F/1/37 |
| JP | 10-254001 | 9/1998 | ............. G02F/1/37 |

OTHER PUBLICATIONS

Patent Abstract of Japan, 10-254001, Sep. 25, 1998.
Patent Abstract of Japan, 10-186427, Jul. 14, 1998.
Patent Abstract of Japan, 06-160930, Jun. 7, 1994.
Patent Abstract of Japan, 10-161165, Jun. 19, 1998.
Patent Abstract of Japan, 06-242458, Sep. 2, 1994.

* cited by examiner

*Primary Examiner*—Leon Scott, Jr.
(74) *Attorney, Agent, or Firm*—Sughrue Mion, PLLC

(57) ABSTRACT

A light wavelength converting element which can reduce an amount of light fed-back to a semiconductor laser. The light wavelength converting element converts a wavelength of a fundamental wave which enters from a first end surface side of an optical waveguide to thereby emit a converted wavelength wave from a second end surface side thereof. The second end surface is inclined with respect to the side surface of the optical waveguide. Also provided is a wavelength stabilized laser having a semiconductor laser, a device which feeds a laser beam emitted from the semiconductor laser back to the semiconductor laser, and a band-pass filter. An optical length between the semiconductor laser and the device is made to be longer than a coherent length of the semiconductor laser, thus improving linearity of a current vs. light output characteristic. Further, a light wavelength converting unit and a light wavelength converting module are provided in which, since an LD-SHG unit formed by a semiconductor laser and a light wavelength converting element is hermetically sealed in a package, the LD-SHG unit can be manufactured easily and has excellent stability over time.

29 Claims, 31 Drawing Sheets

|  | BLUE LASER | GREEN LASER |
|---|---|---|
| $\lambda 0$ | 809nm | 809nm |
| $\lambda 1$ | 946nm | 1064nm |
| $\lambda 2$ | 473nm | 532nm |

LIGHT WAVELENGTH CONVERTING SYSTEM

BACKGROUND OF THE INVENTION

1. Field of the Invention

The present invention relates to a light wavelength converting system which includes a light wavelength converting element, a light wavelength converting module, and a wavelength stabilized laser.

A first aspect of the present invention relates to a light wavelength converting element, and more specifically to an optical waveguide-type light wavelength converting element in which an optical waveguide is formed on a substrate having a nonlinear optical effect.

Further, the present invention relates to a light wavelength converting module in which such a light wavelength converting element as described above and an external resonator-type semiconductor laser which makes a laser beam as a fundamental wave enter the light wavelength converting element are connected to each other.

A second aspect of the present invention relates to a wavelength stabilized laser in which a semiconductor laser beam is passed through a band-pass filter to thereby stabilize an oscillating wavelength thereof.

A third aspect of the present invention relates to a light wavelength converting module which converts a wavelength of a fundamental wave which is emitted from a semiconductor laser by using the light wavelength converting element. More specifically, the third aspect of the present invention relates to a light wavelength converting unit which is provided with a semiconductor laser having an external resonator and with a light wavelength converting element which converts the wavelength of a fundamental wave which is emitted from this semiconductor laser into a second harmonic or the like, and to a light wavelength converting module having this light wavelength converting unit.

2. Description of the Related Art

Regarding the first aspect of the present invention, conventionally, for example, as disclosed in Japanese Patent Application Laid-Open (JP-A) No. 10-254001, there has been known a light wavelength converting element in which an optical waveguide which extends unilaterally is formed on a ferroelectric crystal substrate having a nonlinear optical effect, in which domain inverting portions in which orientations of spontaneous electrodes of the substrate are inverted are periodically formed on the optical waveguide, and in which a fundamental wave, which, within the optical waveguide, guides waves in a direction in which the domain inverting portions are arrayed, is converted into a second harmonic or the like.

This publication (JP-A No. 10-254001) also discloses a light wavelength converting module which connects the aforementioned light wavelength converting element and a semiconductor laser which makes a laser beam as a fundamental wave enter this light wavelength converting element. Further, this publication also discloses a technique in which the aforementioned semiconductor laser and an external resonator having a wavelength selecting element such as a narrow band-pass filter are combined. Due to the operation of the external resonator, a wavelength which is transmitted from the semiconductor laser is locked at a predetermined wavelength.

JP-A No. 6-160930 discloses a light wavelength converting element in which an optical waveguide is formed on a substrate having a nonlinear optical effect to thereby convert a wavelength of a fundamental wave which enters from one end surface side (proximal end surface) of the optical guide and emit a converted wavelength wave from the other end surface (distal end surface) thereof. The proximal end surface and/or the distal end surface of the optical waveguide are formed so as to be inclined in a vertical direction (namely, with respect to a plane orthogonal to a direction in which the optical waveguide extends, within a plane orthogonal to the surface of the substrate, which surface includes this direction). In this structure, the fundamental wave which structures the optical waveguide and which enters the aforementioned proximal end surface and/or the distal end surface is reflected outwardly from these end surfaces at an angle with respect to the direction in which the optical waveguide extends. Therefore, this fundamental wave is prevented from re-entering the optical waveguide and from becoming a fed-back light which enters the semiconductor laser.

In the light wavelength converting module which is structured as described above, generally, a reflection preventing coating (AR (acid resisting) coating) is applied to one end surface and the other end surface including the optical waveguide end surface of the light wavelength converting element. However, such an AR coating does not exhibit a perfect reflectance of 0%. In a case of an $SiO_2$ single-layered coating formed by using a vacuum evaporation device with an ordinary spectral reflection monitor, the reflectance is 0.05% to 0.1%.

Accordingly, the fundamental wavelength is reflected slightly at an emitting end of the light wavelength converting element and then returns to the semiconductor laser, thus adversely affecting oscillation of the semiconductor laser. A more detailed description of the problem due to the fed-back light to the semiconductor laser will be given hereinafter with reference to a case in which a second harmonic is generated by using an external resonator-type semiconductor laser as a fundamental wave light source.

When the driving current of the semiconductor laser is increased, the temperature of the semiconductor laser varies, and the wavelength thereof changes, and the oscillating wavelength thereof changes periodically in the vicinity of a central wavelength selected by a wavelength selecting element. An example of such a change as described above is shown in FIG. 8. This is an example of a case in which the oscillating wavelength and the wavelength of the semiconductor laser are about 950.0 nm and 1 mm, respectively, and the transmitting central wavelength and the transmitting width of the narrow band-pass filter which is the wavelength selecting element are 950.0 nm and 0.5 nm, respectively.

As described above, the light which is reflected and returns to the semiconductor laser and the light which proceeds to the emitting end of the optical-waveguide interfere to each other. However, since an optical path length inside the light wavelength converting element is fixed, the amount (intensity) of the light which returns to the semiconductor laser varies periodically in accordance with the change of the wavelength. When the amount of light which returns to the semiconductor is great, a vertical mode hop occurs or the oscillation strength becomes unstable. For this reason, for example, as shown in FIG. 9, the current vs. light output characteristic (referred to as IL characteristic hereinafter) of the second harmonic swells or the amount of light varies unstably (noise is generated). In a semiconductor laser having such a characteristic as that illustrated in FIG. 9, a problem arises in that, when an APC (automatic power control) or an output stabilizing control is applied to the semiconductor laser, the variation in the amount of light over time becomes large, namely, the noise increases. When such a light wavelength converting module is used as a recording light source for a laser scanner, for example, the problem arises that more noise is generated in the recorded image.

In particular, since the semiconductor laser whose oscillating wavelength has been locked by the above-described external resonator has high monochromaticity, it is easy for the above-described interference to occur, and the problem due to the fed-back light is likely to be caused.

The light wavelength converting element which is disclosed in the above-described JP-A No. 6-106930 has been provided in order to overcome such problems due to fed-back light. However, since the other end surface of the optical waveguide is formed so as to be inclined in a vertical direction, in order to avoid the effect of the fed-back light, this inclination should be made relatively large. Therefore, in this light wavelength converting element, there arises the problem that the converted wavelength wave emitted from the other end surface of the optical waveguide is reflected largely, thus making it difficult to align optical axis of the laser beam with other optical elements.

In a case in which the proximal end surface is inclined as described above, a problem arises in that the light emitted from the semiconductor laser does not efficiently enter the light wavelength converting element.

With regard to the second aspect of the present invention, conventionally, as disclosed in JP-A No. 10-186427, there has been known a wavelength stabilized laser in which the laser beam emitted from the semiconductor laser is passed through the band-pass filter, and light is fed back to the semiconductor laser to thereby stabilize the oscillating wavelength of the semiconductor laser.

The wavelength stabilized laser is fundamentally structured by a semiconductor laser, a collimator lens which makes parallel a laser beam which is emitted in a state of a divergent light from this semiconductor laser, a condenser lens which converges the laser beam which has been made parallel by the collimator lens, a means which returns the converged laser beam to the semiconductor laser, and a band-pass filter which is disposed between the collimator lens and the condenser lens and through which only light of predetermined wavelengths is passed.

In the wavelength stabilized laser, the laser beam which has been selected by the band-pass filter is returned to the semiconductor laser so that the oscillating wavelength of the semiconductor laser is stabilized.

However, in the conventional wavelength stabilized laser having the aforementioned structure, there is a problem in that the linearity of the IL characteristic is unsatisfactory. The present inventors studied the reasons for this and arrived upon the results described below.

In the wavelength stabilized laser having the above-described structure, when an optical member such as a mirror or the like is inserted into the optical path of the laser beam which is emitted from the semiconductor laser, laser beams which have been reflected from the end surfaces of the mirror return to the semiconductor laser. Therefore, from this semiconductor laser, rays of light having different optical path lengths merge together and emitted. In this way, the rays of light having different optical paths interfere with each other. When a driving current which is applied to the semiconductor laser is varied, heat is generated by the semiconductor laser such that the refractive index and the length change, and the oscillating wavelength changes as well. Thus, when the oscillating wavelength changes, since the above-described state in which the rays of light interfere with each other also changes, the linearity of the IL characteristic may deteriorate.

With regard to the third aspect of the present invention, conventionally, an excitation solid-state laser, which excites a solid-state laser crystal by light which is emitted from a laser diode, has been used as light sources of a blue color laser (473 nm) or a green color laser (532 nm). These excitation solid-state lasers, as shown in FIG. 36, include a laser diode 110 in a transverse multi-mode which emits a laser beam 100 as excited light, a condenser lens 112 which converges the laser beam, a solid-state laser crystal 114, a mirror 116 which is disposed ahead of the solid-state laser crystal and which forms an incident side end surface of the solid-state laser crystal 114 and an internal resonator, an SHG crystal 118 for generating a second harmonic, which is disposed between the solid-state laser crystal 114 and the mirror 116 and which has a periodic domain inversion structure, a Brewster's plate 119 which is disposed between the solid-state laser crystal 114 and the SHG crystal 118, and an etalon 120 which is disposed between the SHG crystal 118 and the mirror 116.

Such an excitation solid-state laser uses laser crystals and the like such as a YAG crystal and a YVO4 crystal which are solid-state laser media and on which a rare earth element such as neodymium (Nd) has been doped. However, not only the laser crystals limit an oscillating wavelength to a predetermined wavelength, but also the laser crystal itself exhibits low response frequencies, for example, 100 kHz with the YAG crystal and 2 MHz with the YVO4 crystal. Accordingly, there has been the drawback in that rapid modulation cannot be performed with an excitation solid-state laser. Further, in order to structure the internal resonator, reflection films or AR films, which correspond to an incident wavelength, a resonating wavelength, and an emitting wavelength, respectively, must be provided at the solid-state laser crystalline or the member which forms the resonator, and the manufacturing of the internal resonator becomes complicated. Moreover, due to the use of the laser diode in the transverse multi-mode, a transverse mode hop is caused which causes noise.

Further, in such an excitation solid-state laser, a resonator structure such as a Fabry-Perot type resonator or a ring resonator is adopted. However, a problem arises in that, due to changes in the humidity or atmospheric pressure in the environment in which the laser is used, the length of the resonator changes, and an oscillating wavelength thereby varies. In particular, etalon is apt to be influenced by the environment in which the laser is used. For this reason, JP-A No. 9-266338 discloses an excitation solid-state laser in which a solid-state laser crystal, a laser diode, and all of the optical element forming a resonator are stored or hermetically sealed in a container whose interior is maintained in an airtight state. Changes in the length of the resonator due to changes in humidity or atmospheric pressure are eliminated, thus preventing variations in the output of the solid-state laser and the oscillating wavelength. However, in this excitation solid-state laser, there has been a problem that since all of the main structural components must be hermetically sealed, the device becomes bulky and the manufacturing cost thereof becomes high. Further, there has been a problem in that, when the number of components to be hermetically sealed is large, a mirror or the like deteriorates over time due to gasses which are generated from the respective components so that the output from the solid-state laser thereby deteriorates.

SUMMARY OF THE INVENTION

In view of the aforementioned facts, it is an object of a first aspect of the present invention to provide a light wavelength converting module and a light wavelength converting element which is used for the light wavelength converting module, in which the amount of the light returning to a semiconductor laser can be reduced and optical axis alignment with other optical elements is simple.

There is provided a first light wavelength converting element comprising: (a) a substrate having a nonlinear optical effect; and (b) an optical waveguide formed on the substrate, the optical waveguide having first and second end surfaces which oppose one another, with the second end surface inclined relative to a direction substantially orthogonal to the first end'surface, the second end surface emitting a converted wavelength wave when a fundamental wave enters the first end surface.

The aforementioned angle of the inclination is more preferably 7 degrees or more. Further, when the angle of inclination is at least 3 degrees and less than 7 degrees, it is desirable that a reflection preventing coating (AR (acid resisting) coating) whose reflectance with respect to the fundamental wave is about 0.1% is applied to the other end surface of the optical waveguide. A coating of $SiO_2$ is preferably used.

There is provided a second light wavelength converting system which comprises, (a) a substrate having a nonlinear optical effect; (b) an optical waveguide formed on the substrate, the optical waveguide having first and second end surfaces, the second end surface emitting a converted wavelength wave when a fundamental wave enters the first end surface; and (c) a block of material having a refractive index substantially equal to the refractive index of said optical waveguide connected to said second end surface of said optical waveguide.

There is provided a third light wavelength converting element which comprises, (a) a substrate having a nonlinear optical effect; (b) an optical waveguide formed on the substrate, the optical waveguide having first and second end surfaces, the second end surface emitting a converted wavelength wave when a fundamental wave enters the first end surface; and (c) a phase modulation portion for modulating a phase of the fundamental wave.

It is desirable that the phase modulation portion is disposed between the wavelength converting portion and the other end surface of the optical waveguide.

The light wavelength converting module according to the present invention is formed by directly connecting, without any optical elements disposed therebetween, any of the above-described light wavelength converting elements according to the present invention and an external resonator-type semiconductor laser which makes a laser beam as a fundamental wave enter from one end surface side of the light wavelength converting element.

In the light wavelength converting module according to the present invention, it is desirable that a means to superpose high frequency current on a driving current is provided to drive the external resonator-type semiconductor laser.

In the first light wavelength converting element of the present invention, since the other end surface of the optical waveguide from which the converted wavelength wave is emitted is inclined by 3 degrees or more in a transverse direction (which is within a plane which is substantially parallel to the surface of the substrate, with respect to a plane orthogonal to the direction in which the optical waveguide extends), the fundamental wave which was wave-guided through the optical waveguide and which entered the other end surface reflects outwardly at an angle with respect to the direction in which the optical waveguide extends. Accordingly, the fundamental wave does not re-enter the optical waveguide and is thereby prevented from becoming a fed-back light entering the semiconductor laser.

As compared to a light wavelength converting element which is formed by inclining the other end surface of the optical waveguide in a vertical direction such as the light wavelength converting element disclosed in the aforementioned JP-A No. 6-160930, as shown in FIG. 6, when the amounts of light fed-back to the semiconductor lasers are the same, the first light wavelength converting element of the present invention can reduce the inclination of the other end surface of the optical waveguide. Accordingly, the first light wavelength converting element of the present invention can suppress, to a relatively low level, curving of the converted wavelength wave which is emitted from the other end surface of the optical waveguide and facilitate optical axis alignment with other optical elements.

In the second light wavelength converting element according to the present invention, since the block of a material whose refractive index is substantially equal to an effective refractive index of the optical waveguide is connected to the other end surface of the optical waveguide, the fundamental wave which is emitted as a divergent light from the other end surface of the optical waveguide is not reflected at the interface between the other end surface and the block, and reaches the external end surface of the block (i.e., the end surface at the opposite side of the optical waveguide) and is reflected thereat. Since the fundamental wave in the divergent state thus reflected advances so as to increasingly separate from the optical waveguide as the fundamental wave approaches the optical waveguide side, the fundamental wave does not re-enter the optical waveguide and is prevented from becoming fed-back light which enters the semiconductor laser which is the source of the fundamental wave.

The third light wavelength converting element according to the present invention differs from the second and the first light wavelength converting elements of the present invention in that the fed-back light may enter the optical waveguide, and the fed-back light and the fundamental wave which advances to the other end surface of the optical waveguide interfere with each other. However, since the phase modulation portion which modulates a phase of the fundamental wave which is wave-guided through the optical waveguide is provided, the difference in the optical paths of the fed-back light to one end surface of the optical waveguide and the fundamental wave which proceeds to the other end surface thereof changes rapidly. Accordingly, even when the wavelength is changed, the amount of the fed-back light within a frequency domain which is higher than the frequency domain for actual use can be changed. As a result, the semiconductor laser can operate stably.

The light wavelength converting module according to the present invention is formed by directly connecting the light wavelength converting element and the external resonator-type semiconductor laser to each other, without using the optical elements. Accordingly, it is difficult for the light wavelength converting module to be affected by the fed-back light from the proximal end surface, as compared to a case in which the light wavelength converting element and the external resonator-type semiconductor laser are connected by using optical elements. Accordingly, when an external resonator-type semiconductor laser which has high monochromaticity and in which problems tend to be caused due to fed-back light is used, these problems can be reliably overcome.

In accordance with the present invention, instability of output of the converted wavelength wave due to the fed-back light from the light emitting end surface of the light wavelength converting element is minimized, and a light source with stable output and low noise is obtained.

A semiconductor laser whose oscillating wavelength has been locked by an external resonator has a narrow spectral width and a large interference effect. Accordingly, when such an external resonator-type semiconductor laser is used, in order to obtain a smoother IL characteristic, it is particularly important to take measures against the fed-back light. As a result, the application of the prevent invention is particularly effective.

The connection, without use of optical elements, of the light wavelength converting element and the external resonator-type semiconductor laser means the state of connection such as shown in FIG. 1 which will be described later. The gap between the optical wavelength converting element and the semiconductor laser is decreased to the extent that the IL curvec of the semiconductor laser within the domain for actual use does not swell. For example, when the length of the waveguide-type light wavelength converting element is 10 mm, a gap of about 10 μm or less does not cause swelling.

In accordance with the second aspect of the present invention, an object is to improve the linearity of the IL characteristic in a wavelength stabilized laser in which a band-pass filter is used to stabilize the oscillating wavelength of the semiconductor laser.

There is provided a wavelength stabilized laser, which comprises: a semiconductor laser having a coherent length and a laser beam emitting end surface; a device which feeds a laser beam emitted from the semiconductor laser back to said semiconductor laser along a feed back path having an optical length greater than the coherent length; and a band-pass filter disposed between the device and the semiconductor laser, which substantially passes therethrough only light of predetermined wavelengths.

As a means to return the laser beam to the semiconductor laser, a typical mirror and an optical fiber whose one end is an incident end surface of the converged laser beam and whose other end surface is a reflecting surface, or the like can be preferably used.

In the present invention, when a typical semiconductor laser is used, the optical length from the end surface of the semiconductor laser from which the laser beam is emitted to the position of the semiconductor laser at which the laser beam is fed back is preferably more than 100 mm.

In the wavelength stabilized laser of the present invention, it is preferable to superpose high frequency current so as to drive the semiconductor laser.

Further, in the wavelength stabilized laser, a mirror or a prism which changes the optical path of the laser beam, and an optical material whose refractive index is more than 1 and through which the laser beam is passed, are preferably disposed between the semiconductor laser and a means to feed the laser beam back to the semiconductor laser.

In the preferred embodiment of the present invention, there is provided a light wavelength converting element in which the laser beam which is emitted from the semiconductor laser is converted to a second harmonic.

In the wavelength stabilized laser of the present invention, the optical length from the laser beam emitting end surface of the semiconductor laser to the laser beam fed-back position of the semiconductor laser is made to be longer than the coherent length of the semiconductor laser, thus improving the linearity of the IL characteristic. With reference to the wavelength stabilized laser shown in FIG. 14, a more detailed description of this effect will be given hereinafter.

The wavelength stabilized laser of FIG. 14 has a semiconductor laser (laser diode) 10, a collimator lens 12 which makes parallel a laser beam 11 which is emitted as the divergent light from this semiconductor laser 10, a condenser lens 13 which converges the laser beam 11R which has been made parallel, a mirror 20 which is disposed at a position where the laser beam 11 is converged by the condenser lens 13, a narrow band-pass filter 14 which is disposed between the collimator lens 12 and the condenser lens 13, and a beam splitter 150 which is disposed between the band-pass filter 14 and the collimator lens 12.

In this wavelength stabilized laser of FIG. 14, the coherent length of the semiconductor laser 10 is about 100 mm. The IL characteristic is shown in FIG. 19 for a case in which the optical length between the semiconductor laser 10 and the mirror 20 is 150 mm which is larger than the aforementioned coherent length. The IL characteristic is shown in FIG. 20 for a case in which the optical length between the semiconductor laser 10 and the mirror 20 is 18 mm which is smaller than the aforementioned coherent length. As shown in these figures, as compared to a case in which the optical length is made to be smaller than this coherent length, when the optical length between the semiconductor laser 10 and the mirror 20 is made to be larger than the coherent length, the IL characteristic has a particularly excellent linearity.

In the wavelength stabilized laser of the present invention, a mirror or a prism which changes the optical path of the laser beam, and an optical material whose reflectance is more than 1 and through which the laser beam is passed, are disposed between the semiconductor laser and the means to return the laser beam to the semiconductor laser. In accordance with this structure, even if the optical length from the laser beam emitting end surface of the semiconductor laser to the means to return the laser beam to the semiconductor laser is set to be relatively large, the optical path between the semiconductor laser and the means for feeding back the laser beam to the semiconductor laser can be made compact, and the wavelength stabilized laser can thereby be made compact.

Further, when a typical semiconductor laser is used in the present invention, if the optical length from the laser beam emitting end surface of the semiconductor laser to the laser beam fed-back position of the semiconductor laser is set to be more than 100 mm, the linearity of the IL characteristic can reliably be improved. Namely, the coherent length Lc of the semiconductor laser in a case in which the oscillating wavelength is λ, the spectral width is Δλ, and the reflectance of the medium is n can be determined by the following equation: $Lc=\lambda^2/(2\pi n\Delta\lambda)$, and the coherent length L in a case of a typical semiconductor laser is about 100 mm. Therefore, when a typical semiconductor laser is used, the optical length may be set to be greater than 100 mm.

A first object of the third aspect of the present invention is to provide a light wavelength converting unit and a light wavelength converting module (A) which can be structured simply without using a solid-state laser crystal, (B) which can directly wavelength-convert the fundamental wave emitted from the semiconductor laser, by using the light wavelength converting element, (C) whose manufacturing is facilitated by hermetically sealing a small number of components, and (D) which has excellent stability over time.

A second object of the third aspect of the present invention is to provide a light wavelength converting module which can output the converted wavelength wave stably in spite of changes in the humidity or atmospheric pressure of the environment in which the light wavelength converting module is used.

In order to accomplish the first object of the third aspect of the present invention, there is provided the first light wavelength converting unit, which comprises (a) a semiconductor laser having a reflecting member, and first and second surfaces, the laser when operated emitting a laser beam through the first end surface towards the reflecting member which forms an external resonator, and causes a laser beam to emanate as a fundamental wave from the second end surface; (b) a light wavelength converting element connected directly to the second end surface of the semiconductor laser to convert a wavelength of the fundamental wave when emitted from the second end surface of the semiconductor laser; (c) a connection unit directly connecting the laser to the converting element; and (d) a hermetic sealing member hermetically sealing the connection unit directly connecting the semiconductor laser and the light wavelength converting element.

The reflecting member of the first light wavelength converting unit, and the second end surface of the semiconductor laser form the external resonator. The laser beam which is emitted to the reflecting member side is oscillated by the external resonator so that a laser beam which is a fundamental wave is emitted from the second end surface. The laser beam emitted from the second end surface is wavelength-converted by the light wavelength converting element which is directly connected to the second end surface of the semiconductor laser.

Since the semiconductor laser and the light wavelength converting element are directly connected to each other, there is no need to use a solid-state laser crystal and the first light wavelength converting unit can be structured simply. Accordingly, the fundamental wave which is emitted from the semiconductor laser is directly wavelength-converted by the light wavelength converting element. Here, "direct connection" means that an emitting end surface of the semiconductor laser and the light wavelength converting element are optically connected to each other in a state in which both of the elements are provided so as to be adjacent to each other without interposing a lens therebetween. Namely, "direct connection" does not mean a physical connection of these element.

Since a solid-state laser crystal is not used, the freedom in selecting an oscillating wavelength is enhanced, thus enabling rapid modulation.

In this light wavelength converting unit, since a connection unit of the semiconductor laser and the light wavelength converting element is hermetically sealed by the hermetic sealing member, the manufacturing thereof is facilitated. Further, since the number of components which are hermetically sealed is small, deterioration of the sealed components over time due to gasses which are generated from the respective components can be prevented. Moreover, the connection unit may include a substrate which is needed for connecting the semiconductor laser and the light wavelength converting element, components such as a mount, and wires which are needed for wiring.

In order to accomplish the above-described first object, there is provided a second light wavelength converting unit, which comprises comprising: (a) a semiconductor laser having a reflecting member, and first and second surfaces, the laser when operated emitting a laser beam through the first end surface towards the reflecting member which forms an external resonator, and causes a laser beam to emanate as a fundamental wave from the second end surface; (b) a light wavelength converting element connected directly to the second end surface of the semiconductor laser to convert a wavelength of the fundamental wave when emitted from the second end surface of the semiconductor laser; (c) a lens disposed adjacent to at least one of the first end surface of the semiconductor laser and the emitting end surface of the light wavelength converting element, (d) a connection unit directly connecting the lens to the semiconductor laser and the light wavelength converting element; and (e) a hermetic sealing member hermetically sealing the connection unit directly connecting the lens to the semiconductor laser and the light wavelength converting element.

Similarly to the first light wavelength converting unit, in the second light wavelength converting unit, since there is no need to use a solid-state laser crystal and this unit can be structured simply, the fundamental wave which is emitted from the semiconductor laser can be directly wavelength-converted by the light wavelength converting element. Accordingly, the freedom in selecting an oscillating wavelength is enhanced, and rapid modulation is made possible.

Further, in the second light wavelength converting unit, a lens is disposed adjacent to at least one of the first end surface of the semiconductor laser and the emitting end surface of the light wavelength converting element, and the connection unit which connects the lens, the semiconductor laser, and the light wavelength converting element is hermetically sealed by the hermetic sealing member. Thus, in the same way as the first light wavelength converting unit, it is easy to manufacture the second light wavelength converting unit. Further, because the number of components which are hermetically sealed is small, deterioration of the sealed components over time due to gasses which are generated from the respective components can be prevented. Moreover, since the lens is hermetically sealed, when the lens is mounted to the module or the like, there is no need to align the lens with the semiconductor laser or the lens with the light wavelength converting element. In addition, the connection unit may include a substrate which is needed for connecting the semiconductor laser and the light wavelength converting element, components such as a mount, and wires which are needed for wiring.

In order to accomplish the above-described first object, the light wavelength converting module includes the reflecting member which forms the external resonator, and the first or second light wavelength converting unit. The first or second light wavelength converting unit can be formed as the light wavelength converting module.

In order to accomplish the above-described second object, in the light wavelength converting module, a light-passing coating film is provided on a laser beam incident side surface of the reflecting member, and a high reflectance coating film is provided on a surface opposing the laser beam incident side surface.

In the light wavelength converting module, the laser beam is passed through the light-passing coating film which is provided at the laser beam incident side surface of the reflecting member, and converged at the interface of the substrate of the reflecting member and the high reflection coating film which is provided on the surface at the opposite side of the laser beam incident side surface. Therefore, as compared to a case in which the laser beam is converged onto the surface of the reflecting member, a beam spot diameter on the laser beam incident side surface of the reflecting member increases. As a result, it is difficult for dust to adhere to the surface of the reflecting member so that deterioration of the reflectance of the reflecting member can be prevented.

In order to accomplish the above-described second object, in the light wavelength converting module, the resonator length of the external resonator is made to be larger than the coherent length of the fundamental wave.

In the light wavelength converting module, since the resonator length of the external resonator is made larger than the coherent length of the fundamental wave, the interference due to the fed-back light to the semiconductor laser can be prevented so that the linearity of the IL characteristic can be maintained. Namely, if the resonator length of the external resonator is made larger than the coherent length of the semiconductor laser, when the resonator length of the external resonator changes somewhat, it does not greatly affect the oscillating wavelength of the semiconductor laser. Accordingly, by merely hermetically sealing a small number of the components including the semiconductor laser and the light wavelength converting element, this light wavelength converting module can output a converted wavelength wave stably and can sufficiently respond to changes in humidity or atmospheric pressure of the environment in which the light wavelength converting module is used.

In the above-described light wavelength converting unit and the light wavelength converting module, since the semiconductor laser is driven by the current on which high frequency current has been superposed, vertical mode competition of the semiconductor laser is suppressed to thereby prevent variation of the oscillating wavelength, thus making the light output of the converted wavelength wave stable.

DESCRIPTION OF THE PREFERRED EMBODIMENTS

With reference to the drawings, a description of embodiments of the present invention will be given hereinafter.

First Embodiment

Figure 1:
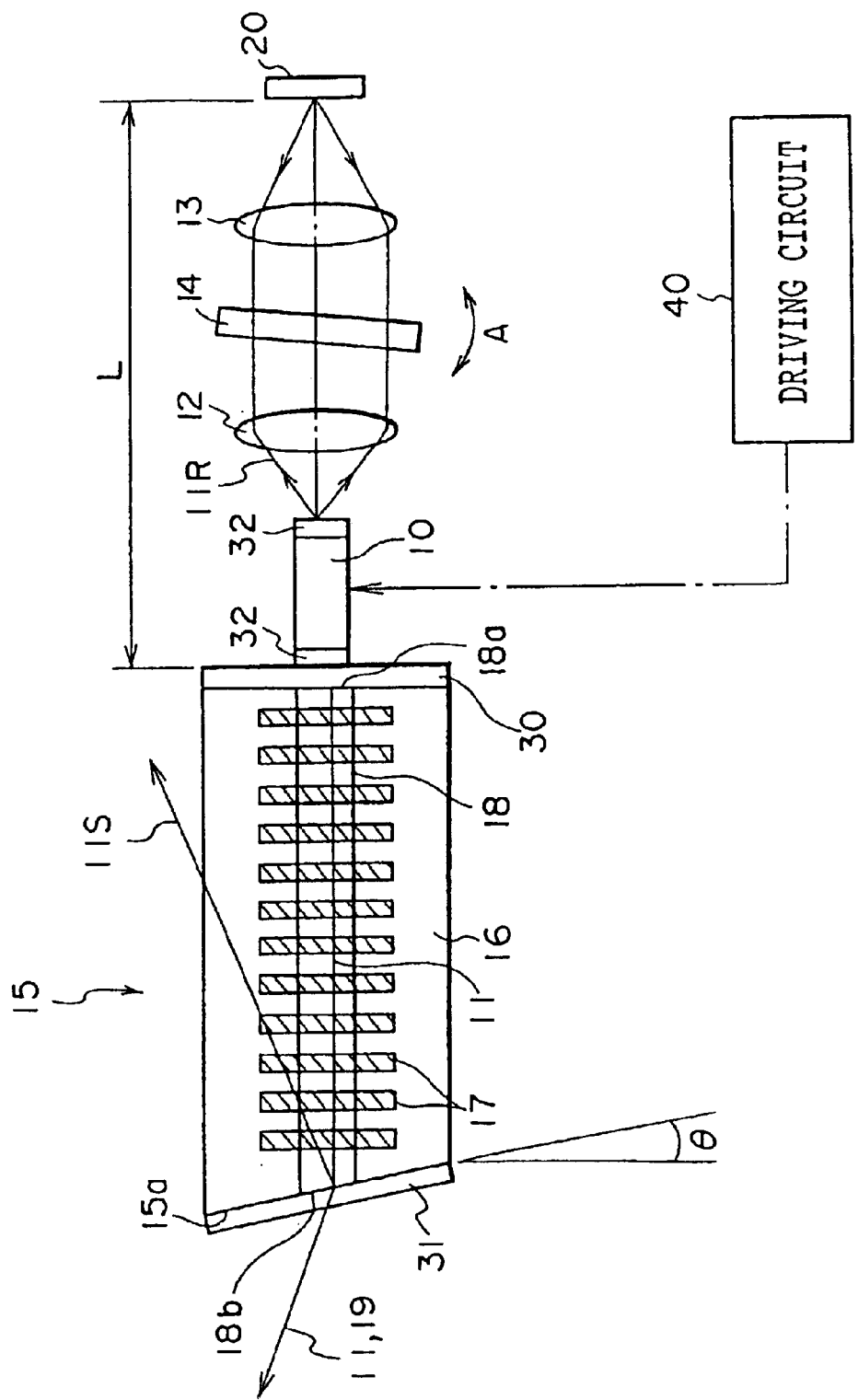
FIG. 1 is a schematic plan view illustrating a light wavelength converting module according to a first embodiment of the present invention.

FIG. 1 shows a light wavelength converting module according to a first embodiment of the present invention. As shown in this figure, this light wavelength converting module comprises a semiconductor laser 10, a collimator lens 12 which makes parallel a laser beam 11R (i.e., a backward emitting light) which is emitted in a state of a divergent light from this semiconductor laser 10, a condenser lens 13 which converges the laser beam 11R which has been made parallel, a narrow band-pass filter 14, as a wavelength selecting element, which is disposed between the collimator lens 12 and the condenser lens 13, and a mirror 20 which is disposed at a position at which the laser beam 11R is converged by the condenser lens 13.

A forward end surface of the semiconductor laser 10 (a left end surface thereof in FIG. 1) is connected directly to an end surface of a waveguide-type light wavelength converting element 15. The semiconductor laser 10 is driven by a semiconductor laser driving circuit 40 which will be described later. Further, LR (low reflectance) coatings 32 are applied to both end surfaces (both wall opening surfaces) of the semiconductor laser 10, with respect to light having oscillating wavelengths thereof.

A light wavelength converting element 15 is formed by a substrate 16, a periodic domain inversion structure, and a channel optical waveguide 18. The substrate 16 is formed by a crystal of a mixture of MgO and $LiNbO_3$ which is a ferroelectric having a nonlinear optical effect and to which the MgO, for example, in an amount of 5 mol % is doped (which is referred to as MgO-LN hereinafter). The periodic domain inversion structure is structured by periodically forming on the substrate 16, domain inverting portions 17 in which orientations of spontaneous electrodes which are made parallel to Z axis of the substrate 16 are inverted. The channel optical waveguide 18 is formed so as to extend along the periodic domain inversion structure.

Figure 2:
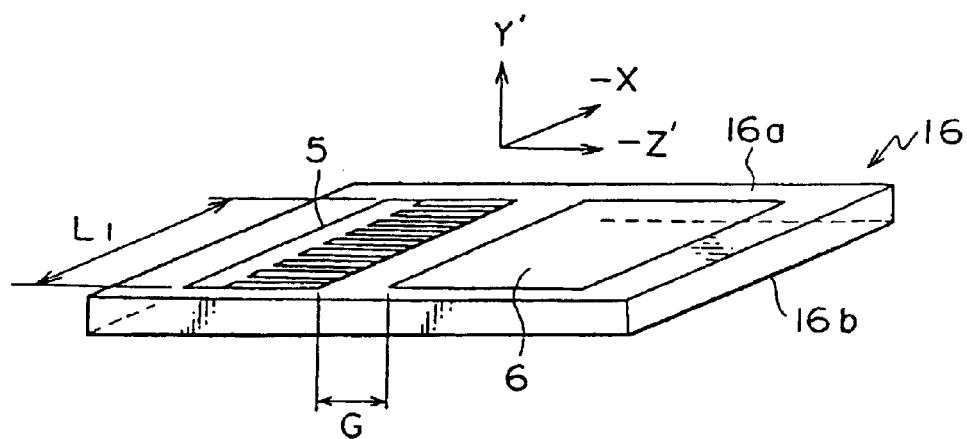
FIG. 2 is a schematic perspective view illustrating a manufacturing state of a light wavelength converting element which structures the light wavelength converting module of FIG. 1.
Figure 3:
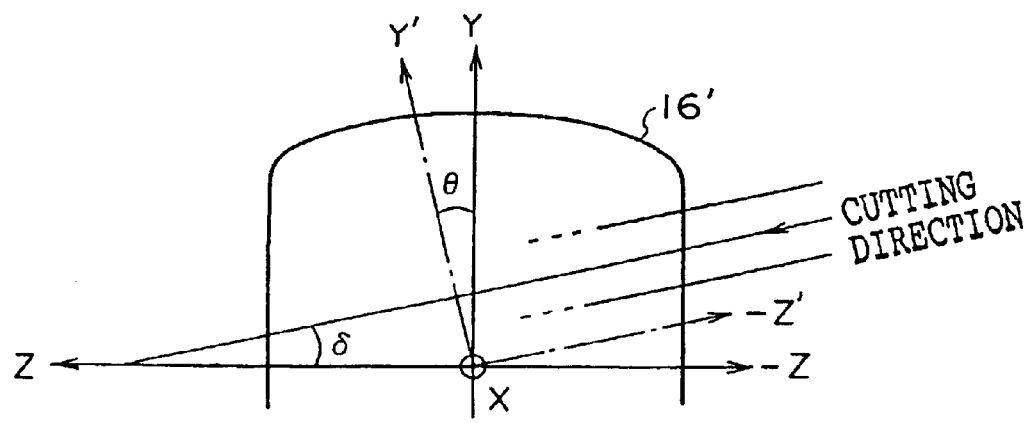
FIG. 3 is a schematic explanatory view of a cutting state of a substrate which is used for the light wavelength converting element of FIG. 2.
Figure 4:
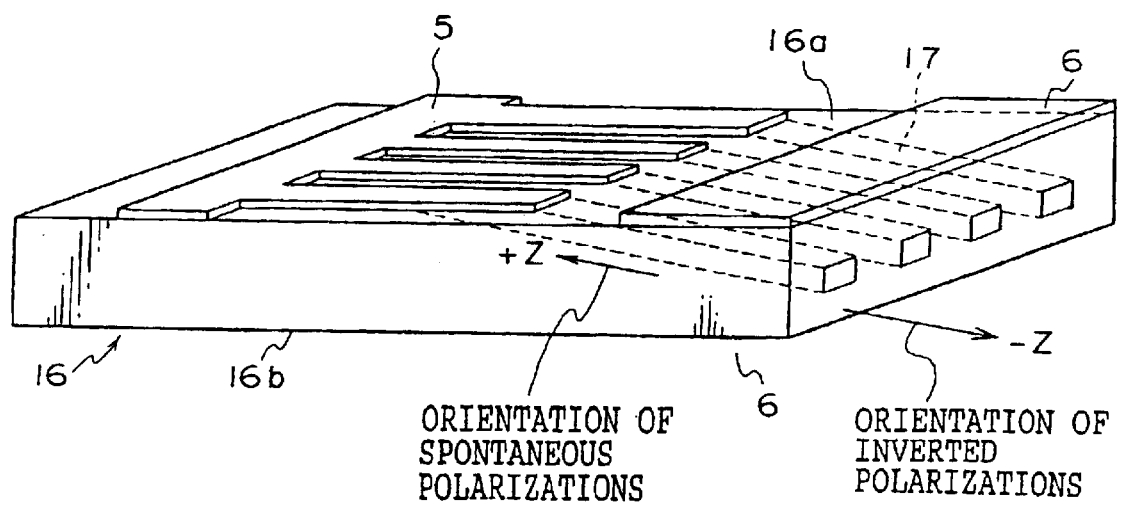
FIG. 4 is a schematic perspective view illustrating domain inverting portions which are formed at the light wavelength converting element of FIG. 2.

With reference to FIGS. 2 to 4, a manufacturing process of this light wavelength converting element 15 will be explained hereinafter. In these figures, as shown in FIG. 3, an MgO-LN substrate 16 is formed such that an ingot 16' of MgO-LN is cut in a direction that forms an angle δ=3 degrees with respect to a direction of Z axis, and then cut. The MgO-LN substrate 16 is single-polarized and has a thickness of 0.3 mm, for example. Further, the accuracy of the cut angle δ=3 is ±1.

A direction which is parallel to surfaces 16a and 16b of the MgO-LN substrate 16 thus formed and which is orthogonal to X axis thereof, and a direction which is perpendicular to the surfaces 16a and 16b thereof are directions each of which forms the angle δ=3 with respect to the direction of the Z axis and a direction of Y axis, respectively. Therefore, these directions are referred to as Z' direction and Y' direction for convenience (and so forth).

As shown in FIG. 2, comb-shaped electrodes 5 and a flat-plate electrode 6 are mounted to the surface 16a of the MgO-LN substrate 16, and the potentials of the comb-shaped electrodes 5 at the side of +Z are positive while the potential of the flat-plate electrode 6 at the side of -Z side is negative.

When a pulse voltage is applied to a portion between these electrodes 5 and 6, as schematically shown in FIG. 4, directions of spontaneous polarizations of the substrate 16 which have been oriented in the direction of +Z are inverted at the portion at which the voltage has been applied thereto so that the domain inverting portions 17 are formed. Further, the spontaneous polarizations of the substrate 16 incline at the angle δ=3 with respect to the surface 16a of the substrate 16. Accordingly, the spontaneous polarizations of the domain inverting portions 17 incline with respect to the surface 16a of the substrate 16 in the same manner as the substrate 16 with respect thereto.

In the present embodiment, the comb-shaped electrode 5 and the flat-plate electrode 6 are made from Cr. However, any material whose electric conductivity is sufficiently lower than that of the MgO-LN substrate 16 can be used for an electrode material. The comb-shaped electrode 5 and the flat-plate electrode 6 can be formed by a well-known photolithography, and each of them has a thickness of 20 to 100 nm, for example, a length $L_1$ of 8 mm, for example, and a gap G between both of the electrodes 5 and 6 is 100 to 500 μm, for example. Further, a cycle Λ of the comb-shaped electrode 5 is 4.75 μm. The length and width of an electrode finger are 200 μm and 0.5 μm, respectively. The width of the flat-plate electrode 6, i,e., the size thereof in the direction of Z' is 100 μm.

The aforementioned voltage was applied in a vacuum in order to prevent leakage of a current. The degree of the vacuum during the application of the voltage is $5 \times 10^{-1}$ Torr or less. Instead of being applied in a vacuum as described above, the voltage can be applied in an insulated oil. Moreover, a pulse width of the voltage applied may be 1 to 10 sec.

Each of the domain inverting portions 17 extends more largely in a direction perpendicularly to the Z axis as the voltage applied increases. As is generally known, in a case in which a wavelength conversion is carried out by making use of the periodic domain inversion structure, a wavelength conversion efficiency becomes the maximum when the ratio of a length of the domain inverting portion 17 and a length of the non-inverting portion in a direction of a wave-guiding is 1:1. This ratio could be 1:1, for example, when the voltage applied is about 1500 V in a case in which the gap G is 200 μm or when the voltage applied is about 3000 V in a case in which the gap G is 400 μm. Values of these optimum voltages are obtained provided that the substrate is set to a room temperature. Namely, when the substrate is at the temperature of 200° C., for example, the optimum voltage in each of the above-described cases is about ⅓.

Next, the channel optical waveguide 18 was formed on the MgO-LN substrate 16 as follows. First, by using a well-known photolithography, a metal (Ta in the present embodiment) mask of which width in the direction of Z' is about 3 to 12 μm was formed in the vicinity of a tip end of the comb-shaped electrodes 5 whose domain inversion is the maximum. Thereafter, a proton exchanging process was performed with respect to the MgO-LN substrate 16, in pyrophosphoric acid, for 30 to 90 minutes, at the temperature of 120 to 200° C. After a Ta mask was removed by using an etching solution, the MgO-LN substrate 16 was annealed in the atmosphere, for 30 to 120 minutes, at the temperature of 300 to 410° C. In this way, as shown in FIG. 1, the channel optical waveguide 18 which extends along the direction in which the domain inverting portions 17 line up is formed.

A condition of the proton exchanging process and the annealing process can be selected from each of the aforementioned ranges so as to optimize a beam diameter and a propagation loss of a wave-guided light. Further, the mask width can be selected within a range of a target wavelength (a fundamental wave ranges from 900 to 1100 nm) so as to be a single mode condition.

Thereafter, the element end surfaces that include both end surfaces 18a and 18b of the channel optical waveguide 18 are optically cut. An AR coating (non-reflective coating) 30 is applied to the element end surface including the end surface 18a, with respect to the laser beam 11 as a fundamental wave. An AR coating 31 is applied to the element end surface including the end surface 18b, with respect to a second harmonic 19 which will be described later and the laser beam 11. Accordingly, preparation of the light wavelength converting element 15 which is shown in FIG. 1 is completed. Further, the second harmonic 19 is removed from the end surface 18b of the optical waveguide 18. The element surface 15a which includes the end surface 18b is cut in a surface substantially parallel to the surface 16a (see FIGS. 2 and 4) of the substrate 16 such that the element surface 15a inclines at an angle of θ (θ≧3) with respect to a surface which is orthogonal to the direction in which the optical waveguide 18 extends.

An operation of the light wavelength converting module according to the first embodiment of the present invention will be explained hereinafter.

The laser beam 11 whose central wavelength is 950 nm and which emits forwardly from the semiconductor laser 10 (to the leftward of FIG. 1) enters the channel optical waveguide 18. The laser beam 11 is wave-guided through the channel optical waveguide 18 in a TE mode so that the wavelength of the laser beam 11 is reduced to ½, namely, it is converted to the second harmonic 19 of 475 nm. At that time, a phase matching (so-called pseudo phase matching) is made in a periodic domain inversion region. This second harmonic 19 also propagates the channel optical waveguide 18 in a wave-guiding mode to thereby emit from the optical waveguide end surface 18b.

The laser beam 11 whose wavelength has not been converted also emits from the optical waveguide end surface 18b in the state of the divergent light. The second harmonic 19 branches from the laser beam 11 by unillustrated band-pass filters, dichroic mirror, or the like, and then provided for a predetermined use.

Next, driving of the semiconductor laser 10 will be explained.

In the present embodiment, the backward emitting light 11R which emits from the semiconductor laser 10 reflects at the mirror 20 and is then fed back to the semiconductor laser 10. Namely, in this device, an external resonator of the semiconductor laser 10 is structured by the forward end surface (the end surface in a left-hand direction of FIG. 1) and the mirror 20. The length L of the external resonator is 150 mm.

A narrow band-pass filter 14 disposed inside the external resonator is used to select a wavelength of the laser beam 11 transmitting therethrough. The semiconductor laser 10 oscillates due to a wavelength selected. The selected wavelength varies in accordance with a position at which the narrow band-pass filter 14 rotates (position at which the filter 14 rotates in a direction of arrow A in FIG. 1). Accordingly, due to an appropriate rotation of the narrow band-pass filter 14, oscillating wavelengths of the semiconductor laser 10 can be selected so as to correspond to cycles of the domain inverting portions 17 and to make a pseudo phase matching of the second harmonic 19.

As previously explained, even when the AR coating 31 is applied to the optical waveguide end surface 18b, reflection of the laser beam 11 as a fundamental wave cannot be entirely prevented. However, in the present embodiment, since the element end surface 15a including the optical waveguide end surface 18b is cut such that the element surface 15a inclines at an angle of θ (θ≧3) with respect to the plane orthogonal to the direction in which the channel optical waveguide 18 extends, the laser beam 11S which is reflected from the end surface 18b forms an angle with respect to the direction in which the channel optical waveguide 18 extends, and reflects outwardly. Therefore, the reflected laser beam 11S cannot re-enter the channel optical waveguide 18. Accordingly, the reflected laser beam 11S is prevented from becoming a fed-back light which enters the semiconductor laser 10 as a light source of a fundamental wave.

The above-described effects will be explained in more detail hereinafter.

The laser beam 11 which is obtained with respect to the wavelength of 950 nm had a typical beam diameter whose width is about 6 μm and whose depth is about 3 μm. Then, a spreading angle Φ of the laser beam 11 in a far-field is 11.5 degrees in a transverse direction and 22.8 degrees in a depth direction (a full width of $1/e^2$).

Figure 5:
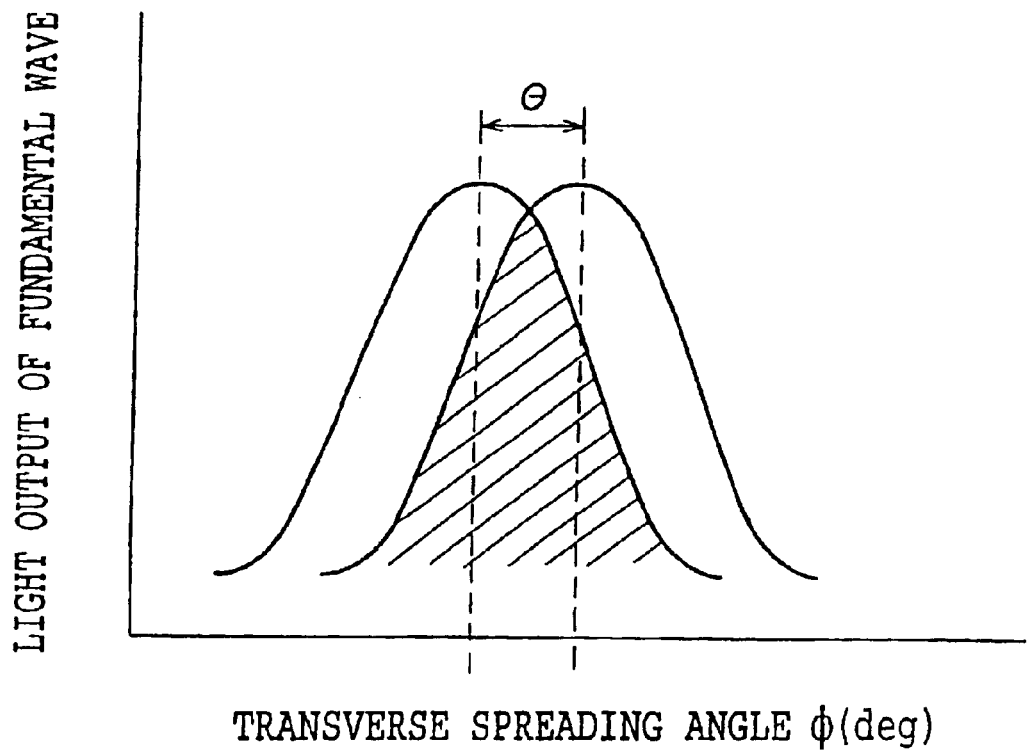
FIG. 5 is a graph illustrating a relationship of an inclined cut angle, an amount of the fed-back light to the semiconductor laser, and a transverse spreading angle of a fundamental wave of the light wavelength converting element in the light wavelength converting module of FIG. 1.
Figure 6:
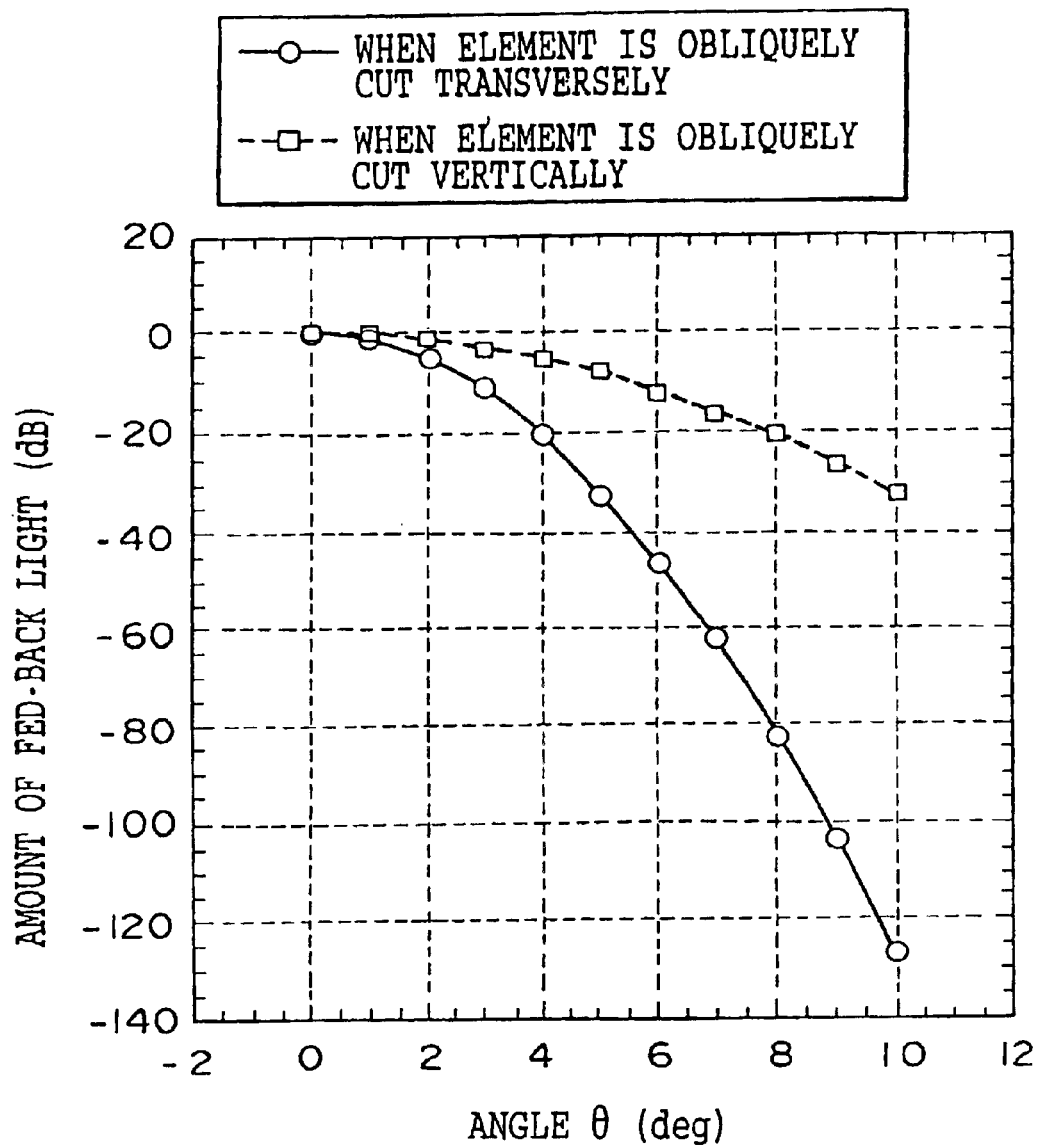
FIG. 6 is a graph illustrating a relationship between an inclined cut angle and the amount of a fed-back light to the semiconductor laser of the light wavelength converting element in the light wavelength converting module of FIG. 1.

The amount of a fed-back light with respect to an inclined cut angle θ can be estimated with respect to the spreading angle Φ by an overlapping integral which is shown by the shadowed portion in FIG. 5. When the overlapping integral is η and the reflectance by the AR coating 31 is R, the amount of a fed-back light which is actually fed back to the semiconductor laser 10 is R×η. Accordingly, an effect which can be obtained by inclining the optical waveguide 18b appears η times. The relationship between the overlapping integral η, i.e., the amount of the fed-back light and the inclined cut angle θ will be such a relationship as shown in FIG. 6. When the AR coating 31 is formed by a $SiO_2$ single coating layer or the like, ordinarily, the reflectance R is about 0.1% (when the amount of incident light is 0 dB, the amount of reflected light is −30 dB). Further, other than the $SiO_2$, as a coating material which causes the reflectance R to have about 0.1%, $CaF_2$ and $BaF_2$ can be used.

The relationship between the amount of the fed-back light and the inclined cut angle θ is shown in FIG. 6 both in a case in which the element end surface 15a including the end surface of the optical waveguide 18b is cut in a transverse direction (by inclining the element end surface 15a within a surface parallel to the surface 16a of the substrate 16, with respect to a plane orthogonal to a direction in which the optical waveguide 18 extends) as in the present invention and in a case in which it is cut in a vertical direction thereof (by inclining the element end surface 15a, with respect to a surface which is orthogonal to a direction in which the optical waveguide 18 extends, within the surface which includes the direction in which the optical waveguide 18 extends and which is perpendicular to the surface 16a of the substrate 16).

Figure 7:
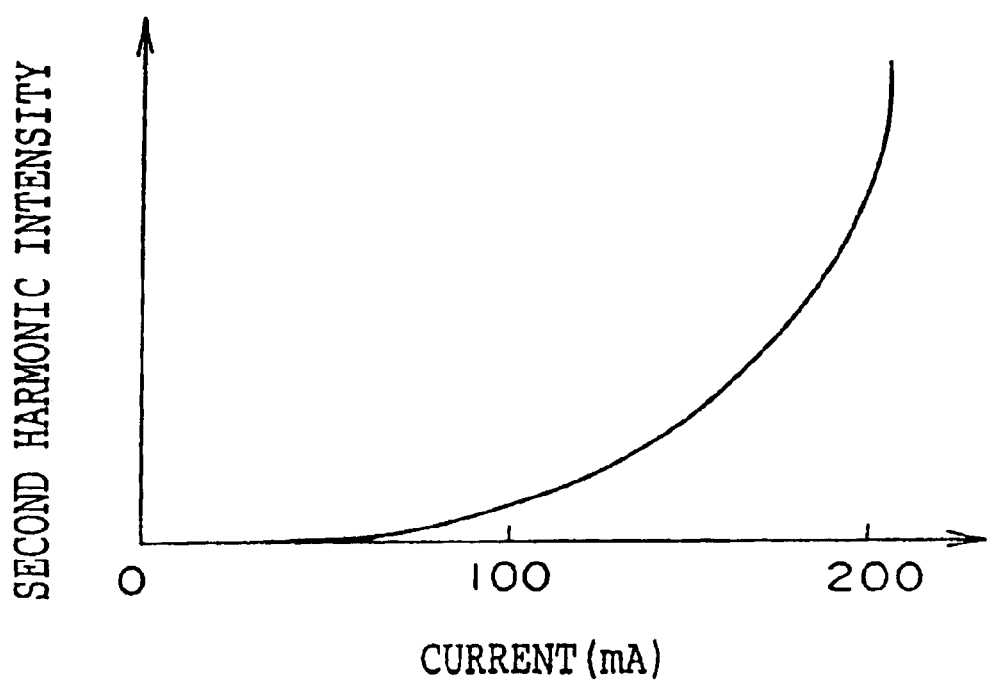
FIG. 7 is a graph illustrating an IL characteristic of a second harmonic in the light wavelength converting module of FIG. 1.
Figure 8:
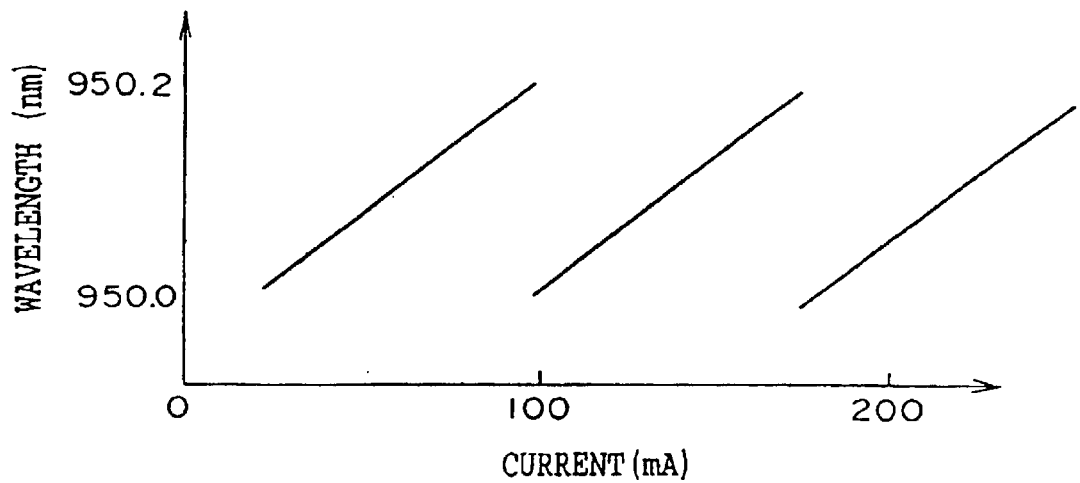
FIG. 8 is a graph illustrating the state of the change of an oscillating wavelength due to the change of a driving current of the semiconductor laser.
Figure 9:
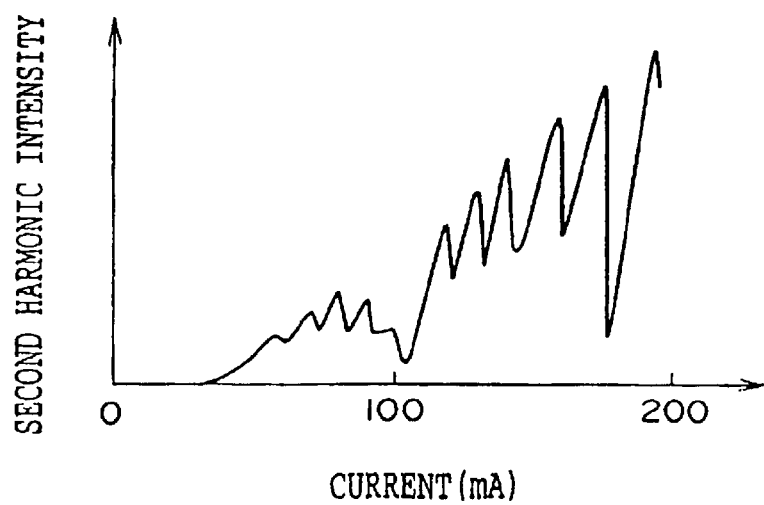
FIG. 9 is a graph illustrating an example of an IL characteristic of the second harmonic in a conventional light wavelength converting module.

In accordance with various experiments conducted by the inventors of the present invention, when the amount of the fed-back light is equal to or less than −40 to −60 dB, as shown in FIG. 7, it is found that the second harmonic 19 can obtain smooth IL characteristic by not being affected by the fed-back light. Accordingly, when the AT coating was applied, as shown in FIG. 6, the element end surface 15a needs to be cut by being inclined within the surface parallel to the substrate surface and to have the inclined cut angle θ of 3 degrees or more.

When this inclined cut angle θ is large, a direction in which the second harmonic 19 emits curves largely, thus making it difficult to adjust the second harmonic 19 during modulation. By taking this into consideration, it can be said that the smaller the inclined cut angle θ the better.

By taking the influence due to the fed-back light into consideration, even when the AR coating 31 is not applied, no problem is caused provided that the amount of the fed-back light is −60 dB or less. Accordingly, due to the characteristics which are shown in FIG. 6, desirably, the inclined cut angle θ is 7 degrees or more. When the inclined cut angle θ is 3 degrees $\leq θ<7$ degrees, the reflectance R of the AR coating 31 with respect to the laser beam 11 (i.e., the fundamental wave) is 0.1%.

Further, when the element end surface 15a including the optical waveguide end surface 18b is cut by being inclined with respect to a surface which is orthogonal to a direction in which the optical waveguide 18 extends and within the surface which includes the direction in which the optical waveguide 18 extends and which is perpendicular to the surface 16a, the laser beam 11 in the perpendicular direction extends largely, it is not preferable because a problem is arisen that a larger inclined cut angle θ is needed as compared to the above-described embodiment.

Second Embodiment

Figure 10:
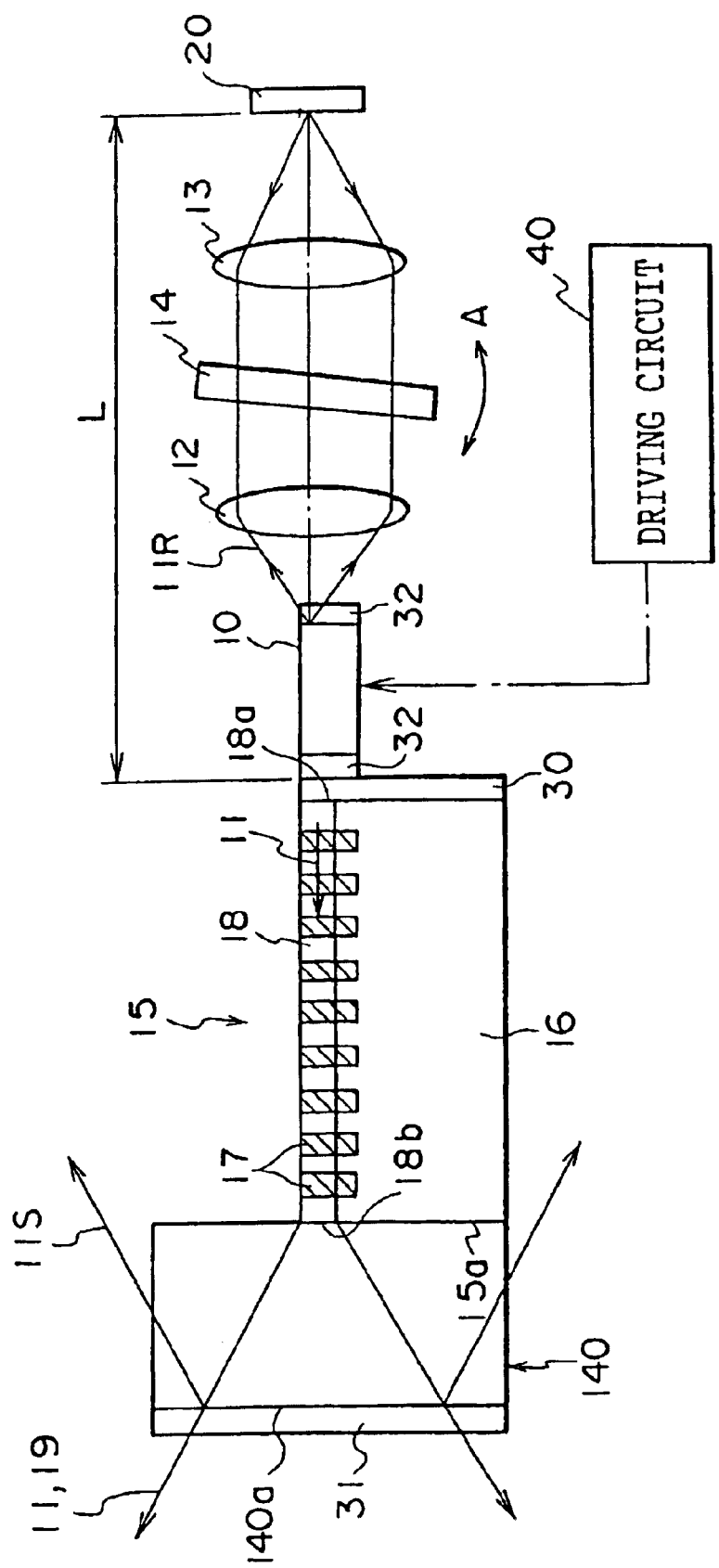
FIG. 10 is a schematic side view illustrating a light wavelength converting module according to a second embodiment of the present invention.

Next, with reference to FIG. 10, a light wavelength converting module according to a second embodiment of the present invention will be explained. Further, in FIG. 10, components identical to those of FIG. 1 are denoted by the same reference numerals, and a description thereof will be omitted (the same may be said of a third embodiment).

In the second embodiment of the present invention, the AR coating 31 is applied to the element end surface 15a including the optical waveguide end surface 18a of the light wavelength converting element 15 such that the AR coating 31 is applied to an external end surface 140a of an MgO-LN crystal block 140 which is made from the same material as the substrate 16 and which has the same refractive index as the effective refractive index of the channel optical waveguide 18, namely, the end surface at the opposite side of the optical waveguide 18.

In the above-described structure, the laser beam 11 (the fundamental wave) which enters, in a state of the divergent light, from the optical waveguide end surface 18a does not reflect at the interface of this end surface 18b and the MgO-LN crystal block 140, reaches the external end surface 140a of the MgO-LN crystal block 140, and reflects therefrom. Since the reflected laser beam 11S advances so as to branch from the optical waveguide 18 as it approaches the channel optical waveguide 18 side (the right side of the figure), the reflected laser beam 11S is prevented from becoming a fed-back light which enters the semiconductor laser 10.

From the above-description, it is obviously understood that when the laser beam 11 enters the external end surface 140a of the MgO-LN crystal block 140 so as to incline at least in a slight angle with respect to the external end surface 140a, the reflected laser beam 11S is prevented from becoming a fed-back light entering the semiconductor laser 10. Since a spreading angle of the laser beam 11 which emits from the optical wavelength end surface 18b is generally 10 to 20 degrees, in the same manner as the first embodiment of the present invention, as shown in FIG. 7, also in this case, smooth IL characteristic of the second harmonic 19 can be obtained.

Third Embodiment

Figure 11:
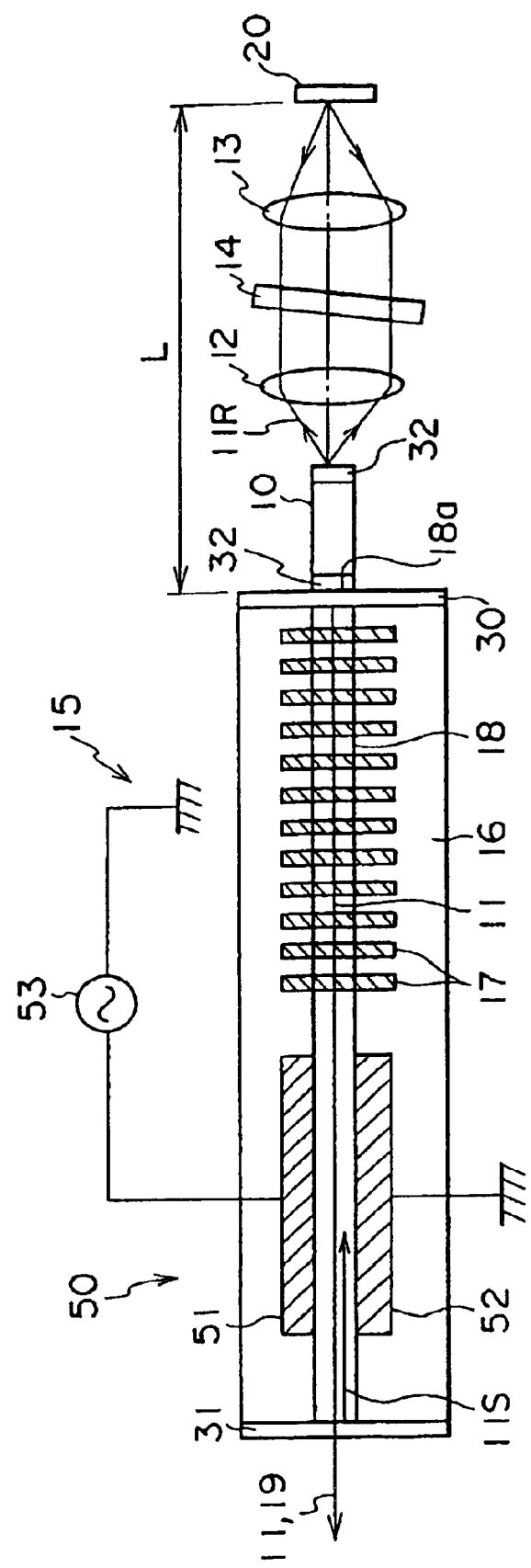
FIG. 11 is a schematic plan view illustrating a light wavelength converting module according to a third embodiment of the present invention.

With reference to FIG. 11, a light wavelength converting module according to a third embodiment of the present invention will be explained.

In the third embodiment of the present invention, a phase modulation portion 50 is formed between a wavelength converting portion (a portion on which the domain inverting portions 17 are formed) and the end surface 18b of the channel optical waveguide 18 of the light wavelength converting element 15 so that a phase of the laser beam 11 which waves-guides the optical waveguide 18 is modulated. This phase modulation portion 50 is formed by a pair of electrodes 51 and 52 which are disposed at both sides of the channel optical waveguide 18, and an alternating power source 53 which applies an alternating voltage between the pair of the electrodes 51 and 52.

A condition of a proton exchanging process and an annealing process for forming this channel optical waveguide 18 is basically the same as that in the first embodiment of the present invention and can be selected to optimize a beam diameter and a propagation loss of a wave-guided light. After the channel optical wave guide 18 and the domain inverting portions 17 have been formed, the electrodes 51 and 52 are formed by ordinary photolithography and metal deposition.

In the third embodiment of the present invention, the light wavelength converting element 15 is structured in the same manner as those of the first and second embodiments of the present invention except that since the laser beam 11S (the fed-back light) which has been reflected from the optical waveguide end surface 18b can enter the channel optical waveguide 18, the fed-back light 11S and the laser beam 11 forwarding to the optical waveguide end surface 18b interfere to each other. However, in this case, when the alternating voltage is applied between the electrode 51 and the electrode 52, a difference of an optical path between the fed-back light 11S onto the optical waveguide end surface 18a, and the laser beam 11 forwarded to the optical waveguide end surface 18b side changes rapidly. Therefore, even when a wavelengh changes, it is possible to change the amount of the fed-back light in a frequency domain which is higher than a frequency domain for an actual use. As a result, the semiconductor laser 10 can move stably.

Accordingly, also in this case, in the same manner as the first embodiment of the present invention, as shown in FIG. 7, smooth IL characteristic of the second harmonic 19 can be obtained.

As disclosed in Japanese Patent Application Laid-Open (JP-A) No. 11-141311 which was filed by the present applicants, there has been a known technique in which high frequency current is superposed on a driving current of the semiconductor laser to thereby suppress variation of the amount of light of the converted wavelength wave due to a vertical mode competition of the semiconductor laser. Also in the light wavelength converting module of the present invention, since high frequency current is superposed on the driving current to drive the semiconductor laser, smoother IL characteristic can be obtained with respect to the converted wavelength wave.

As disclosed in JP-A No. 10-161165, there has been known a waveguide light modulating element which is manufactured by forming an optical waveguide having a wave conversion portion on a substrate that can provide electro-optical and nonlinear optical effects and an electro-optical light modulator which modulates a wave-guided light that is wave-guided through the optical waveguide 18. However, as described above, the electro-optical light modulator is provided, and the light wavelength converting element of the present invention can be structured, thus modulating the wavelength converting wave.

Fourth Embodiment

With respect to a drawing, a fourth embodiment of the present invention will be explained hereinafter.

Figure 12:
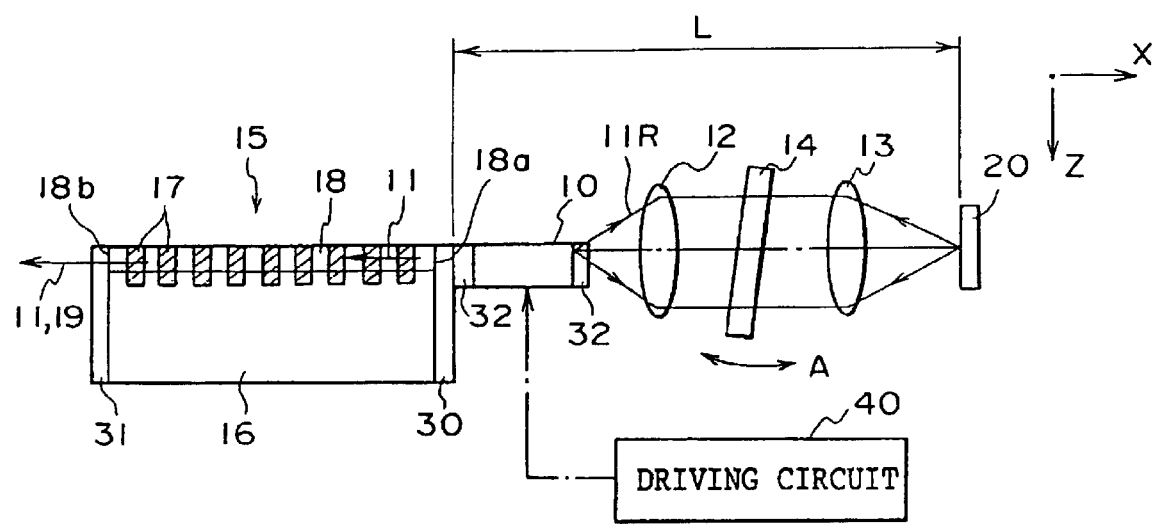
FIG. 12 is a side view illustrating a light wavelength converting module having a wavelength stabilized laser according to a fourth embodiment of the present invention.
Figure 13:
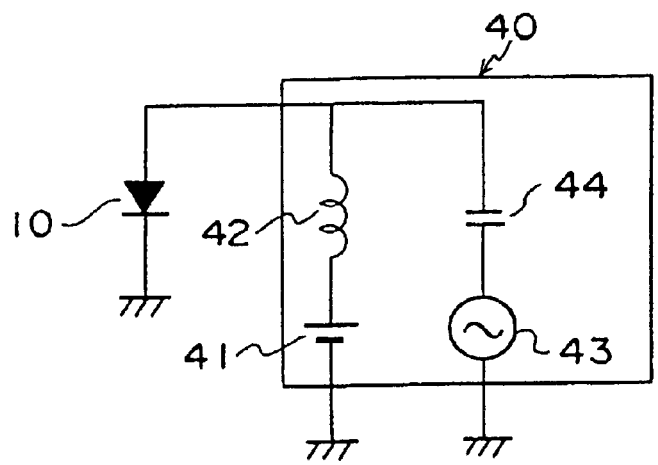
FIG. 13 is a circuit diagram of the driving circuit which is used for the wavelength stabilized laser of FIG. 1.

FIG. 12 shows a light wavelength converting module having a wavelength stabilized laser according to a fourth embodiment of the present invention. FIG. 13 shows a semiconductor laser driving circuit.

As shown in FIG. 12, this light wavelength converting module comprises the semiconductor laser 10, the collimator lens 12 which makes parallel the laser beam 11R (i.e., backward emitting light) which emits in the state of the divergent light from this semiconductor laser 10, the condenser lens 13 which converges the laser beam 11R whiche is made parallel, the narrow band-pass filter 14 as a wavelength selecting element which is disposed between the collimator lens 12 and the condenser lens 13, and the mirror 20 which is disposed at a position where the laser beam 11R is converged by the condenser lens 13.

The forward end surface of the semiconductor laser 10 (the left end surface thereof in FIG. 12) is connected directly to the end surface of the waveguide-type light wavelength converting element 15. The semiconductor laser 10 is driven by the semiconductor laser driving circuit 40 which will be described later.

The light wavelength converting element 15 is formed by the substrate 16, the periodic domain inversion structure, and the channel optical waveguide 18. The substrate 16 is formed by the crystal of the mixture of MgO and LiNbO$_3$ which is the ferroelectric having the nonlinear optical effect and to which the MgO, for example, in an amount of 5 mol % is doped (which is referred to as MgO-LN hereinafter). The periodic domain inversion structure is structured by periodically forming on the substrate 16, the domain inverting portions 17 in which orientations of the spontaneous electrodes which are parallel to the Z axis of the substrate 16 are inverted. The channel optical waveguide 18 is formed to extend along the periodic domain inversion structure.

The periodic domain inversion structure is formed such that the domain inverting portions 17 line up in the direction of the X axis of the substrate 16. By taking a wavelength dispersion of the refractive index of MgO-LN into consideration, each of the domain inverting portions 17 has a cycle Λ of 4.75 μm so as to be a primary cycle with respect to the wavelength in the vicinity of about 950 nm. Such a periodic domain inversion structure as described above can be formed by a method which is disclosed in JP-A No. 6-242478.

The channel optical waveguide 18 can be formed by such a method as below described. After the periodic domain inverting portions 17 have been formed on the channel optical waveguide 18, metal mask patterns are formed on the surface of +Z of the substrate 16 by a known photolithography and lifting-off. This substrate 16 is immersed in pyrophosphoric acid, the proton exchanging process of the substrate 16 is performed, and after the pyrophosphoric acid has been removed, the annealing process thereof is then performed. Thereafter, both of the end surfaces 18a and 18b of the channel optical waveguide 18 are subjected to an edge-cut. When the AR non-reflective coating 30 is applied to the element end surface including the end surface 18a, with respect to the laser beam 11 as the fundamental wave, and the AR coating 31 is applied to the element end surface including the end surface 18b, with respect to the second harmonic 19, the light wavelength converting element 15 is thereby prepared. Further, LR (low reflectance) coatings 32 are applied to both end surfaces (both wall opening surfaces) of the semiconductor laser 10, with respect to light having oscillating wavelengths thereof.

An operation of the light wavelength converting module will be explained hereinafter.

The laser beam 11 whose central wavelength is 950 nm and which emits forwardly from the semiconductor laser 10 (to the leftward of FIG. 1) enters the channel optical waveguide 18. This laser beam 11 is wave-guided through the channel optical waveguide 18 in the TE mode so that the wavelength of the laser beam 11 is reduced to ½, namely, it is converted to the second harmonic 19 of 475 nm. At that time, a phase matching (so-called pseudo phase matching) is made in a periodic domain inversion region, and this second harmonic 19 also propagates the channel optical waveguide 18 in a wave-guiding mode, and then emits from the optical waveguide end surface 18b.

The laser beam 11 whose wavelength has not been converted also emits from the optical waveguide end surface 18b in the state of the divergent light. The second harmonic 19 is branched from the laser beam 11 by unillustrated band-pass filters, dichroic mirror, or the like, and then provided for a predetermined use.

The driving of the semiconductor laser 10 will be explained, hereinafter.

In the present embodiment, the backward emitting light 11R which emits from the semiconductor laser 10 reflects from the mirror 20 and fed back to the semiconductor laser 10. Namely, in this device, the external resonator of the semiconductor laser 10 is structured by the forward end surface (the end surface in the left-hand direction of FIG. 12) of the semiconductor laser 10 and the aforementioned mirror 20. The letter L of the figure refers to the length of the external resonator. Further, the optical length between the end surface from which the backward emitting light 11R of the semiconductor laser 10 emits and the mirror 20 is 150 mm.

The narrow band-pass filter 14 which is disposed inside the external resonator is used to select a wavelength of the laser beam 11 transmitting through the filter 14. Since the semiconductor laser 10 is oscillated by the selected wavelength, and the selected wavelength varies in accordance with a position at which the narrow band-pass filter 14 rotates (position at which the filter 14 rotates in a direction of arrow A in FIG. 12), due to an appropriate rotation of the narrow band-pass filter 14, it is thereby possible to stably select the oscillating wavelengths of the semiconductor laser 10 which correspond to the cycles of the domain inverting portions 17 and which make a pseudo phase matching of the second harmonic 19.

When a plurality of FP modes between both wall opening surfaces of the semiconductor laser 10 within the transmission width of the narrow band-pass filter 14, a vertical mode competition may occur. In order to suppress the occurrence of this vertical mode competition, the semiconductor laser driving circuit 40 is structured as shown in FIG. 2. Namely, in this driving circuit 40, high frequency current which is transmitted from an AC power source 43 through the capacitor 44 is superposed on a DC power source component which is transmitted from a DC power source 41 through a coil 42. Then, the current on which high frequency current has been superposed is applied to the semiconductor laser 10.

In this way, since high frequency current is superposed on a driving current which is applied to the semiconductor laser 10, the driving current is modulated to thereby drive the semiconductor laser 10. Accordingly, the driving current does not stay in a region where the vertical mode competition may occur, thus suppressing the occurrence of the vertical mode competition.

In the present embodiment, a coherent length of the semiconductor laser 10 is about 100 mm. As described above, the optical length between the end surface from which the backward emitting light 11R of the semiconductor laser 10 emits and the mirror 20 is 150 mm which is larger than the aforementioned coherent length. Accordingly, this semiconductor laser 10 as a wavelength stabilized laser is excellent in linearity of IL (current to light output) characteristics.

Fifth Embodiment

Figure 14:
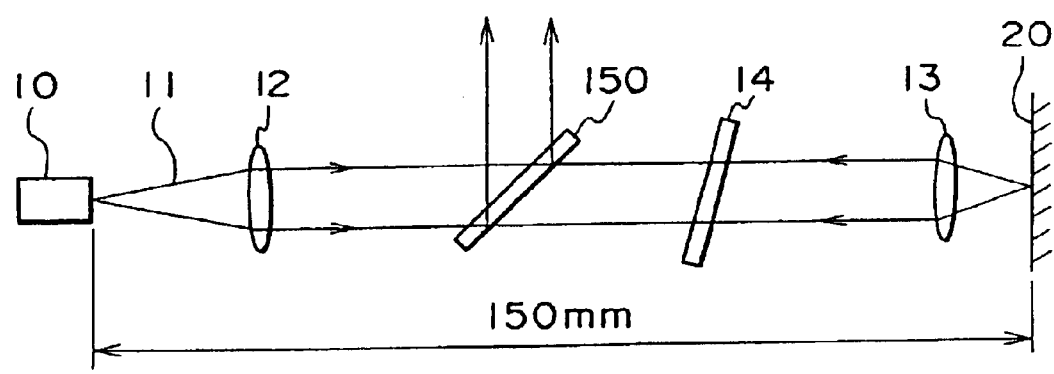
FIG. 14 is a side view illustrating a wavelength stabilized laser according to a fifth embodiment of the present invention.

With reference to FIG. 14, a fifth embodiment of the present invention will be explained hereinafter. Further, in FIG. 14, components identical to those of FIG. 12 are denoted by the same reference numerals, and a description thereof will be omitted (the same may be said from sixth to ninth embodiments of the present invention).

FIG. 14 shows a wavelength stabilized laser according to a fifth embodiment of the present invention. As shown in this figure, this wavelength stabilized laser comprises the semiconductor laser 10, the collimator lens 12 which makes parallel the laser beam 11R which is emitted in the state of the divergent light from this semiconductor laser 10, the condenser lens 13 which converges the laser beam 11R which has been made parallel, the mirror 20 which is disposed at the position where the laser beam 11 has been converged by the condenser lens 13, the narrow band-pass filter 14 which is disposed between the collimator lens 12 and the condenser lens 13, and a beam splitter 150 which is disposed between the band-pass filter 14 and the collimator lens 12.

The transmission band (half width) is 1.0 nm, and the wavelength of the laser beam 11 whose central wavelength is 950 nm is selected by this band-pass filter 14. The laser beam 11 having the wavelength thus selected reflects from the mirror 20 and returns to the semiconductor laser 10, that is to say, a light feed-back is performed, thus stabilizing an oscillating wavelength of the semiconductor laser 10.

A portion of the laser beam 11 having the wavelength thus stabilized is split from an optical path between the semiconductor laser 10 and the mirror 20 by using the beam splitter 150, and the split portion is provided for a predetermined use.

Figure 19:
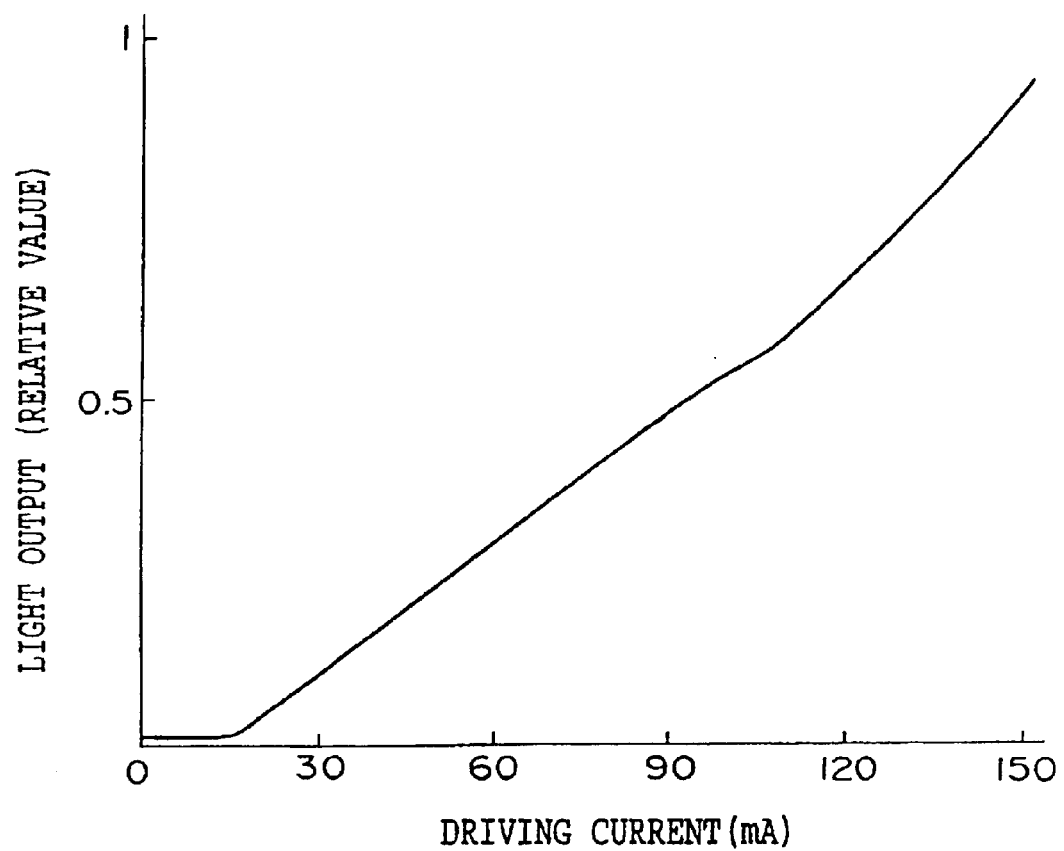
FIG. 19 is a graph showing an IL characteristic of the wavelength stabilized laser in FIG. 13.

In this wavelength stabilized laser, a coherent length of the semiconductor laser 10 is about 100 mm. The optical length between the end surface from which the semiconductor laser 10 emits and the mirror 20 is 150 mm which is larger than the aforementioned coherent length. Accordingly, this wavelength stabilized laser has IL characteristic as shown in FIG. 19.

Figure 20:
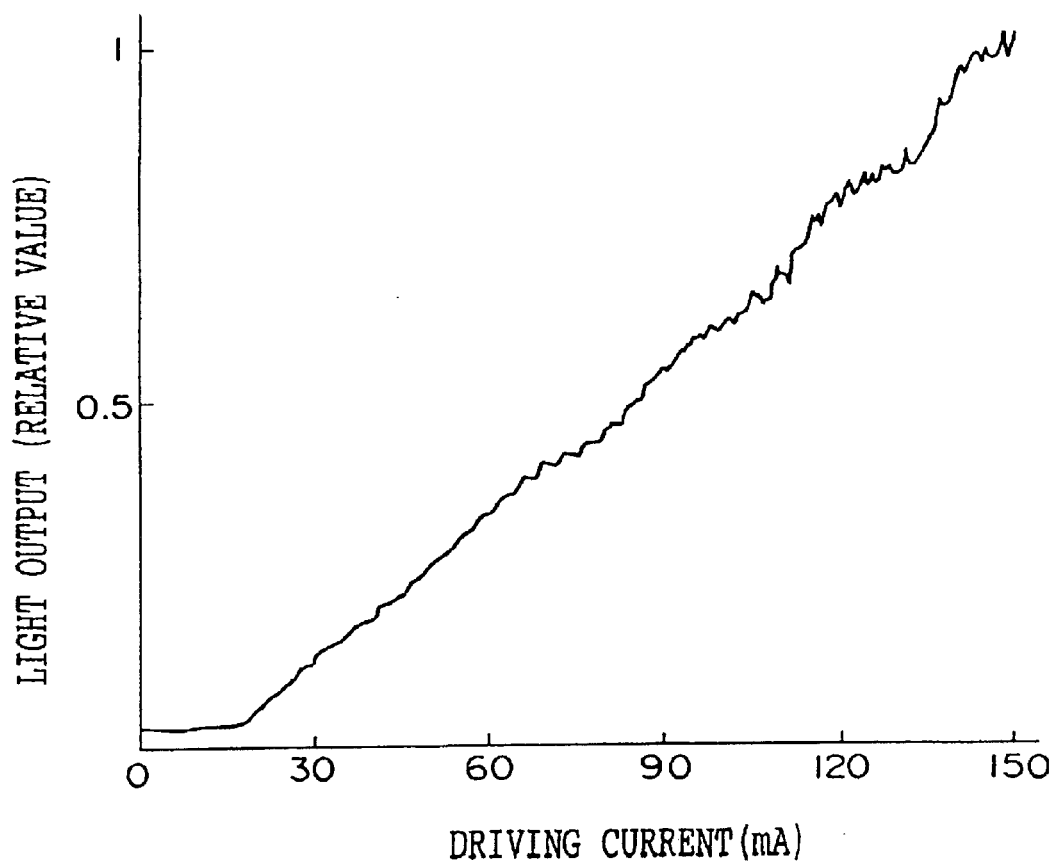
FIG. 20 is a graph showing an example of an IL characteristic of a conventional wavelength stabilized laser.

Conversely, the IL characteristic of this wavelength stabilized laser which is structured in the same manner as in FIG. 14 except that the optical length between the end surface from which the semiconductor laser 10 emits and the mirror 20 is 18 mm which is smaller than the aforementioned coherent length is as shown in FIG. 20. As can be seen from these FIGS. 19 and 20, as compared when the optical length is made to be smaller than this coherent length, when the optical length between the semiconductor laser 10 and the mirror 20 is made to be larger than the coherent length, the IL characteristic have a particularly excellent linearity.

Even when the optical length between the semiconductor laser 10 and the mirror 20 is made to be slightly larger than the aforementioned coherent length, the same effect can be obtained as that when the optical length is 150 mm.

Sixth Embodiment

Figure 15:
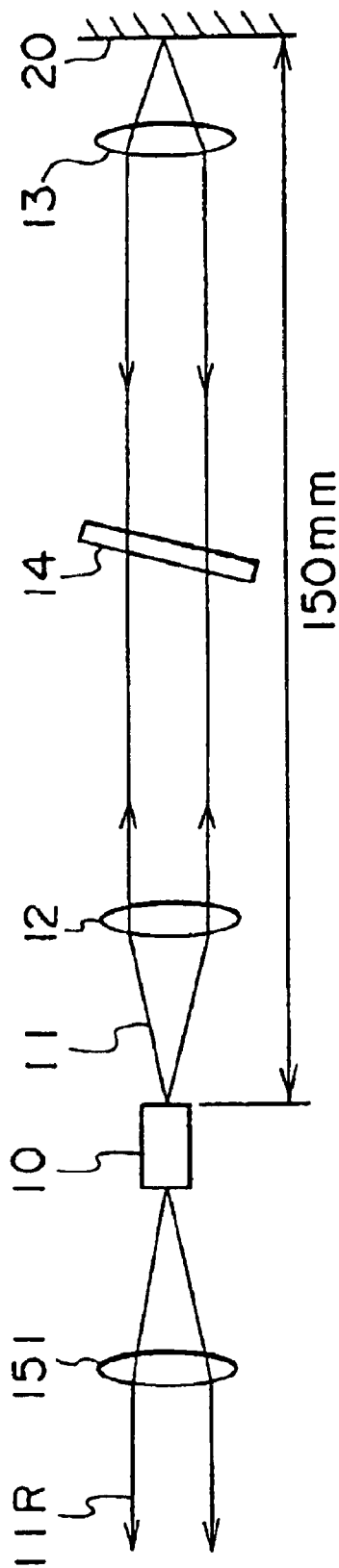
FIG. 15 is a side view illustrating a wavelength stabilized laser according to a sixth embodiment of the present invention.

With reference to FIG. 15, a sixth embodiment of the present invention will be explained hereinafter.

A wavelength stabilized laser of the sixth embodiment of the present invention is structured in the same manner as that of the fifth embodiment of the present invention in FIG. 14 except that the laser beam 11R as a backward emitting light which emits from the semiconductor laser 10 is made parallel by the collimator lens 151 and provided for a predetermined use.

With such a structure, the wavelength stabilizing effect which is the same as that of the fifth embodiment of FIG. 14 can be obtained by using the band-pass filter 14. Also in this case, the optical length between the semiconductor laser 10 emitting end surface and the mirror 20 is 150 mm which is larger than 100 mm which is the coherent length of the semiconductor laser 10, thus improving the linearity of IL characteristic.

Seventh Embodiment

Figure 16:
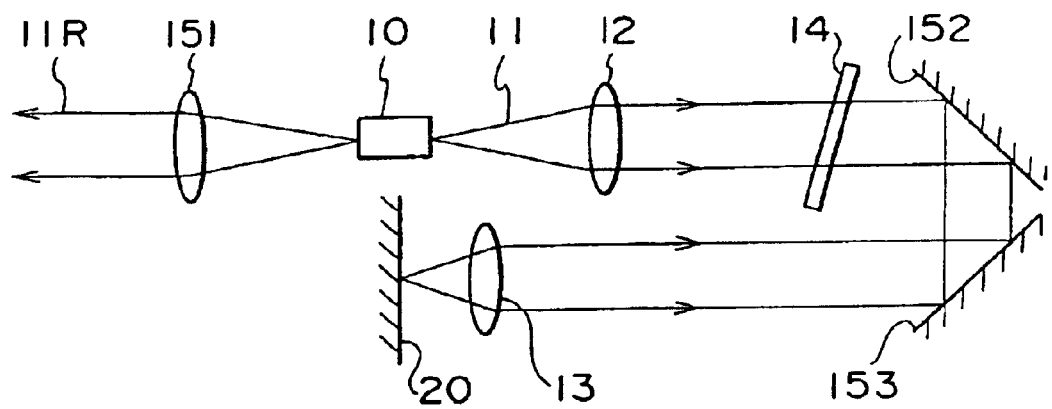
FIG. 16 is a side view illustrating a wavelength stabilized laser according to a seventh embodiment of the present invention.

With reference to FIG. 16, a seventh embodiment of the present invention will be explained hereinafter.

A wavelength stabilized laser of the seventh embodiment of the present invention is structured in the same manner as that of the sixth embodiment of the present invention in FIG. 15 except that mirrors 152 and 153 are interposed between the semiconductor laser 10 and the mirror 20 along the optical path of the laser beam 11 to thereby reflect the optical path of the laser beam 11.

By doing this, even when the optical length between the semiconductor laser 10 and the mirror 20 is made to be larger than the coherent length of the semiconductor laser 10, the optical path between the semiconductor laser 10 and the mirror 20 can be made compact so that the wavelength stabilized laser can be made compact.

Eighth Embodiment

Figure 17:
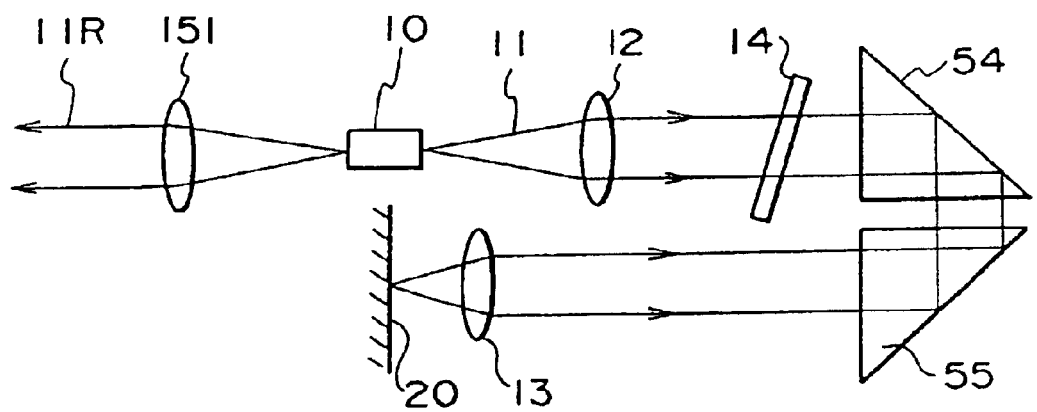
FIG. 17 is a side view illustrating a wavelength stabilized laser according to an eighth embodiment of the present invention.

Next, with reference to FIG. 17, an eighth embodiment of the present invention will be explained.

A wavelength stabilized laser of the eighth embodiment of the present invention is structured in the same manner as that of the seventh embodiment of the present invention of FIG. 16 except that instead of the mirrors 152 and 153, prisms 54 and 55 are used as a means of returning the optical path of the laser beam 11 between the semiconductor laser 10 and the mirror 20. Also, with this structure, the optical path between the semiconductor laser 10 and the mirror 20 can be made compact so that the wavelength stabilized laser can be made compact.

Further, the above-described mirrors and prisms can be used to change an optical path as many times as possible. During the change of the optical path, it is possible to use a layout which is appropriate to minimize the optical path between the semiconductor laser 10 and the mirror 20. Moreover, when a prism/prisms are used to change the optical path, no problem arises whether to reflect or refract the optical path.

Moreover, instead of using the above-described mirrors and prisms, the optical path can be changed by inserting an optical material through which the laser beam 11 transmits and which has a reflective index of more than 1, into the optical path of the laser beam 11 between the semiconductor laser 10 and the mirror 20. For instance, when an optical material having a reflective index of 1.5 is inserted into the entire optical path, the optical length can be 1.5 times as long as that before the insertion of the optical material while the distance between the semiconductor laser 10 and the mirror 20 before the optical material is provided therebetween.

Specifically when such an optical material is inserted into the optical path, for example, there can be adopted a method in which the entire structure of the wavelength stabilized laser which is shown in FIG. 14 can be immersed in an optical material which is formed by a gas or a liquid or an optical material which is formed by a solid is disposed on an optical path of the laser beam 11.

Ninth Embodiment

Figure 18:
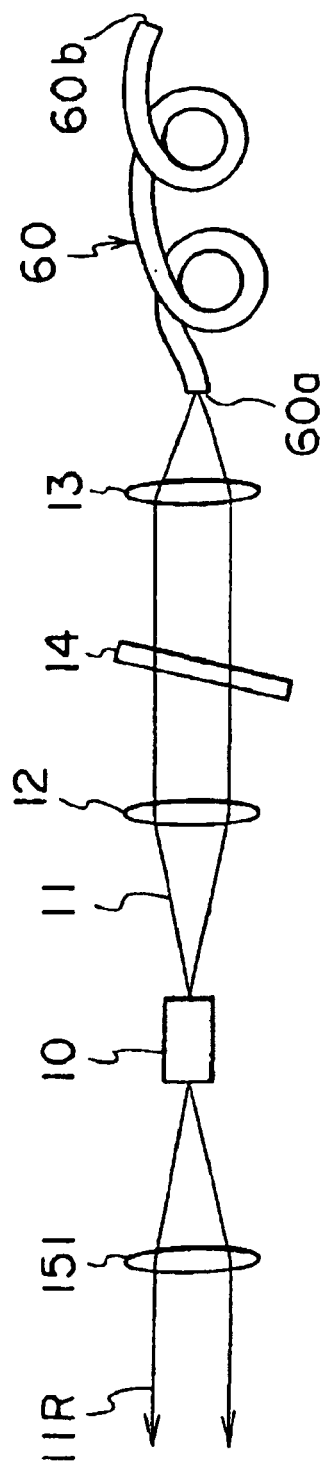
FIG. 18 is a side view illustrating a wavelength stabilized laser according to a ninth embodiment of the present invention.

With reference to FIG. 18, a ninth embodiment of the present invention will be explained hereinafter.

A wavelength stabilized laser according to the ninth embodiment of the present invention is structured in the same manner as the sixth embodiment of the present invention in FIG. 15 except that the mirror 20 is replaced by an optical fiber 60.

A non-reflection coating is applied to an end surface 60a of this optical fiber 60, with respect to the laser beam 11. The end surface 60a is used as an incident end surface and the laser beam 11 which has been converged by the condenser lens 13 enters therein. On the other hand, a high reflection coating is applied to the other end surface 60b of this optical fiber 60, with respect to the laser beam 11. The end surface 60b is used as a reflection surface, and reflects the laser beam 11 therefrom.

With this structure, the laser beam 11 which emits from the end surface 60a and which enters the optical fiber 60, propagates inside the optical fiber 60 in a wave-guiding mode, reflects from the end surface 60b, propagates by return therein, emits from the end surface 60a, and returns to the semiconductor laser 10. Accordingly, also in this case, the laser beam 11 whose wavelength is selected by using the band-pass filter 14 is fed back to the semiconductor laser 10 to thereby stabilize the oscillating wavelength thereof.

Tenth Embodiment

With reference to the drawings, a more detailed description of a light wavelength converting module according to an embodiment of the present invention will be given hereinafter.

Figure 26:
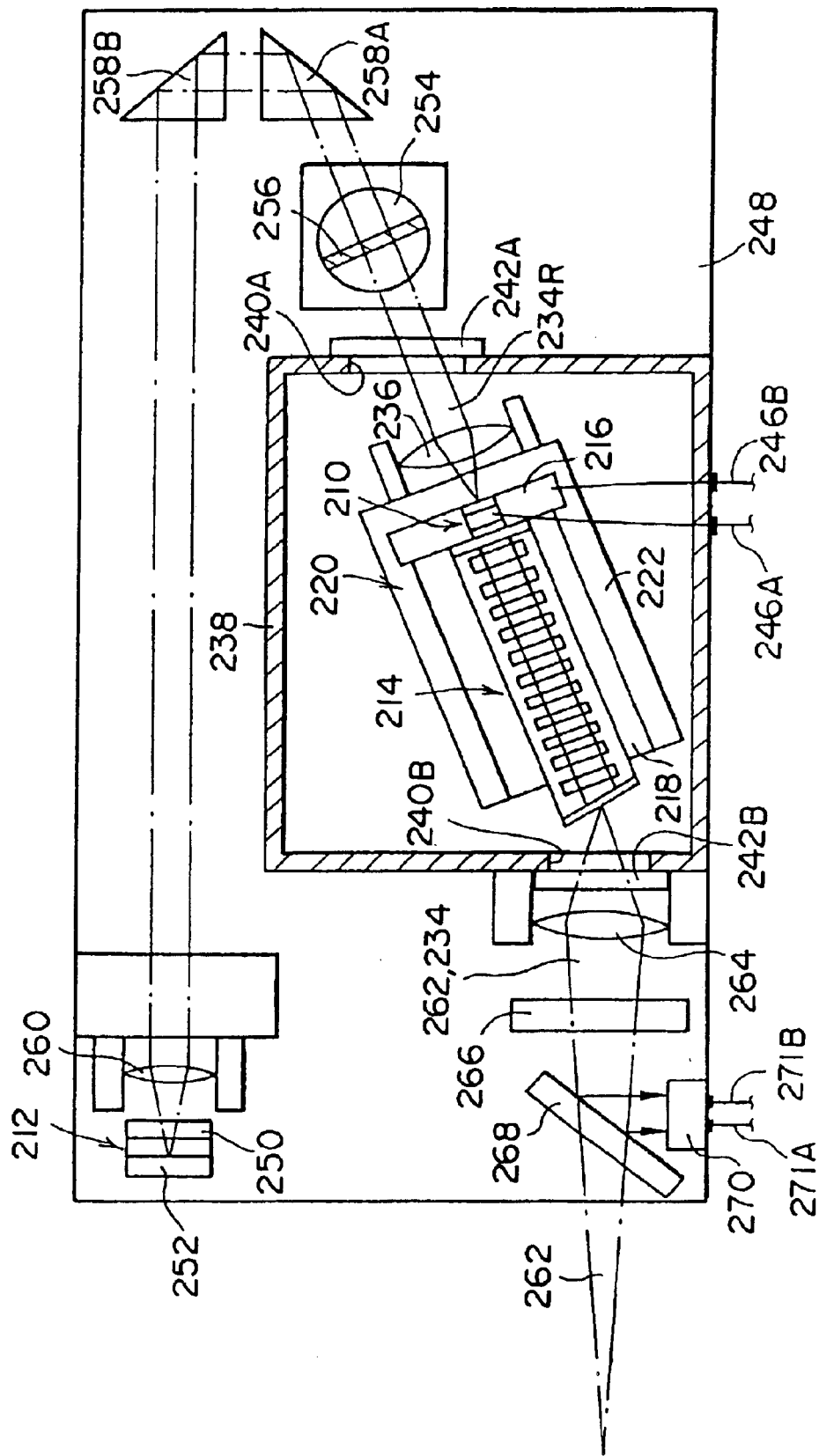
FIG. 26 is a plan view of the light wavelength converting module according to the tenth embodiment of the present invention.

As shown in FIG. 26, the light wavelength converting module according to the present embodiment includes: a semiconductor laser 210 having a first end surface (backward light emitting end surface) and a second end surface opposing the first end surface (forward light emitting end surface); a mirror 212 as a reflecting member which together with the forward light emitting end surface structures an external resonator; and a waveguide-type light wavelength converting element 214 which wavelength-converts a fundamental wave which emits from the semiconductor laser 210 and which outputs a second harmonic.

Figure 21A:
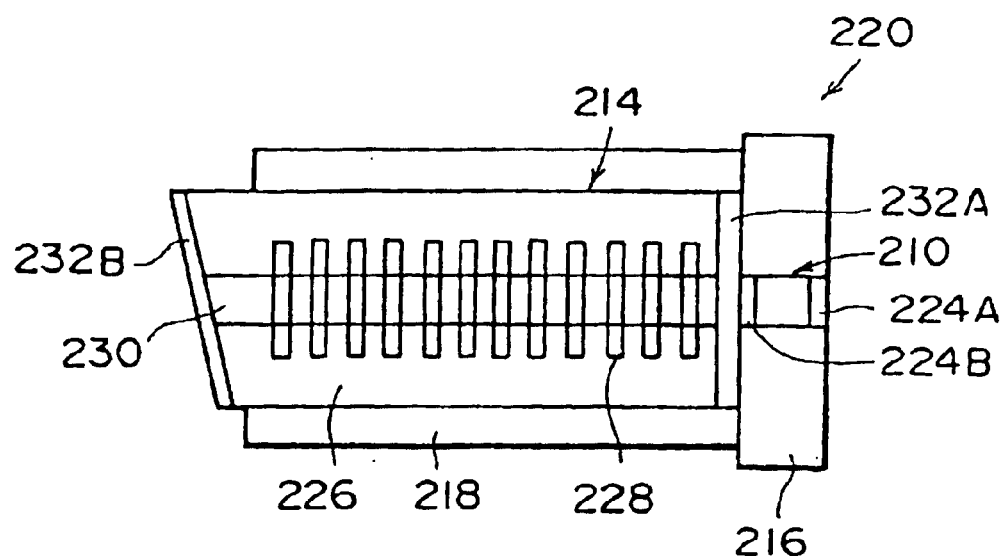
FIG. 21A is a plan view of an LD-SHG unit of a light wavelength converting module according to a tenth embodiment of the present invention.
Figure 21B:
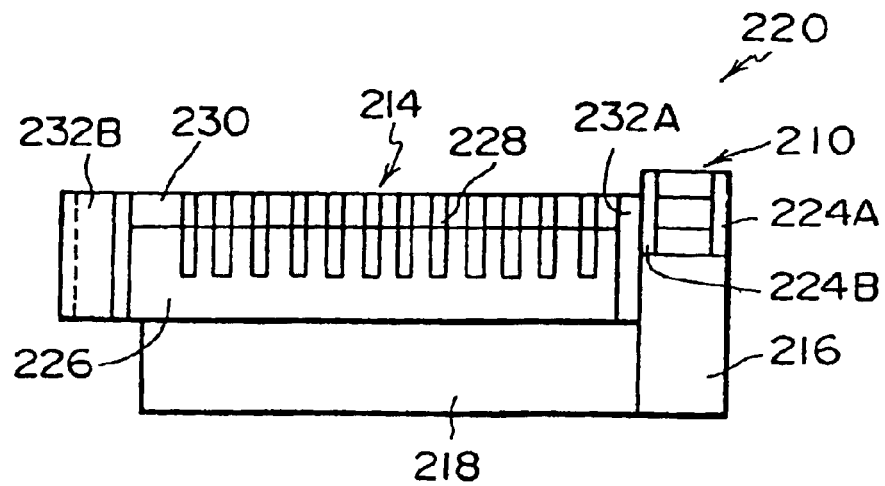
FIG. 21B is a cross-sectional view of the LD-SHG unit of FIG. 21A taken along the optical axis thereof.
Figure 22:
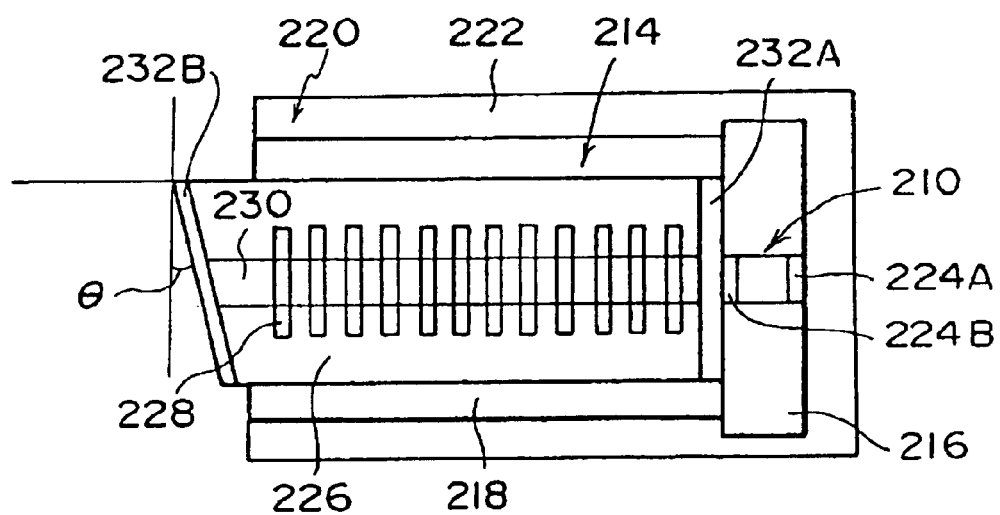
FIG. 22 is a plan view of the LD-SHG unit after being fixed onto the substrate.

As shown in FIGS. 21A and 21B, the semiconductor laser (LD) 210 is held by a mount 216 for a semiconductor laser. The light wavelength converting element 214 which is structured by a second harmonic generating element (SHG) is held by a mount 218 for a light wavelength converting element. The semiconductor laser 210 and the light wavelength converting element 214, in a state of being held by these mounts 216 and 218, are aligned to each other so that the emitting portion of the semiconductor laser 210 and the waveguide portion (incident portion) of the light wavelength converting element 214 correspond to each other, thus manufacturing an LD-SHG unit 220. As a result, the light wavelength converting element 214 is connected directly to the forward light transmitting end surface of the semiconductor laser 210. As shown in FIG. 22, the LD-SHG unit 220 is fixed to a substrate 222.

The semiconductor laser 210 is an ordinarily semiconductor laser (laser diode) having a single-ridged space mode (transverse single mode) of a Fabry-Perot (FP) type. Both end surfaces (wall opening surfaces) of the semiconductor laser 210 are applied by LR (low reflectance) coatings 224A and 224B. For example, the reflectance of the LR coating 224A with respect to the semiconductor laser 210 as a fundamental wave can be 30%, while that of the LR coating 224B with respect thereto can be 30%.

The light wavelength converting element 214 has a substrate 226 which is formed by a crystal of the mixture of MgO and $LiNbO_3$ which is a ferroelectric having a nonlinear optical effect and to which the MgO, for example, in an amount of 5 mol % is doped (which is referred to as MgO-LN hereinafter). On the substrate 226, are formed a periodic domain inversion structure of domain inverting portions 228 which are formed in a predetermined cycle A later described and in which orientations of spontaneous electrodes which are made parallel to Z axis of the substrate 226 are inverted, and a channel optical waveguide 230 which extends along this periodic domain inversion structure Further, an AR coating 232A is applied to the semiconductor laser side end surface of the light wavelength converting element 214, with respect to the fundamental wave thereof, while an AR coating 232B is applied to the light emitting side end surface thereof, with respect to the second harmonic and the fundamental wave. Moreover, JP-A No. 10-254001 discloses a manufacturing method of an optical waveguide-type of the light wavelength converting element 214 having a periodic domain inversion structure in more detail.

The forward emitting end surface of the light wavelength converting element 214 is cut to be inclined to thereby form an inclined surface in an angle of θ (θ≧3) with respect to the plane orthogonal to a direction in which a channel optical waveguide 230 extends. In this way, since the forward emitting end surface including the optical waveguide end surface was cut to be inclined, the fundamental wave does not re-enter the channel optical waveguide 230 and is prevented from becoming a fed-back light entering the semiconductor laser 210.

Figure 23:
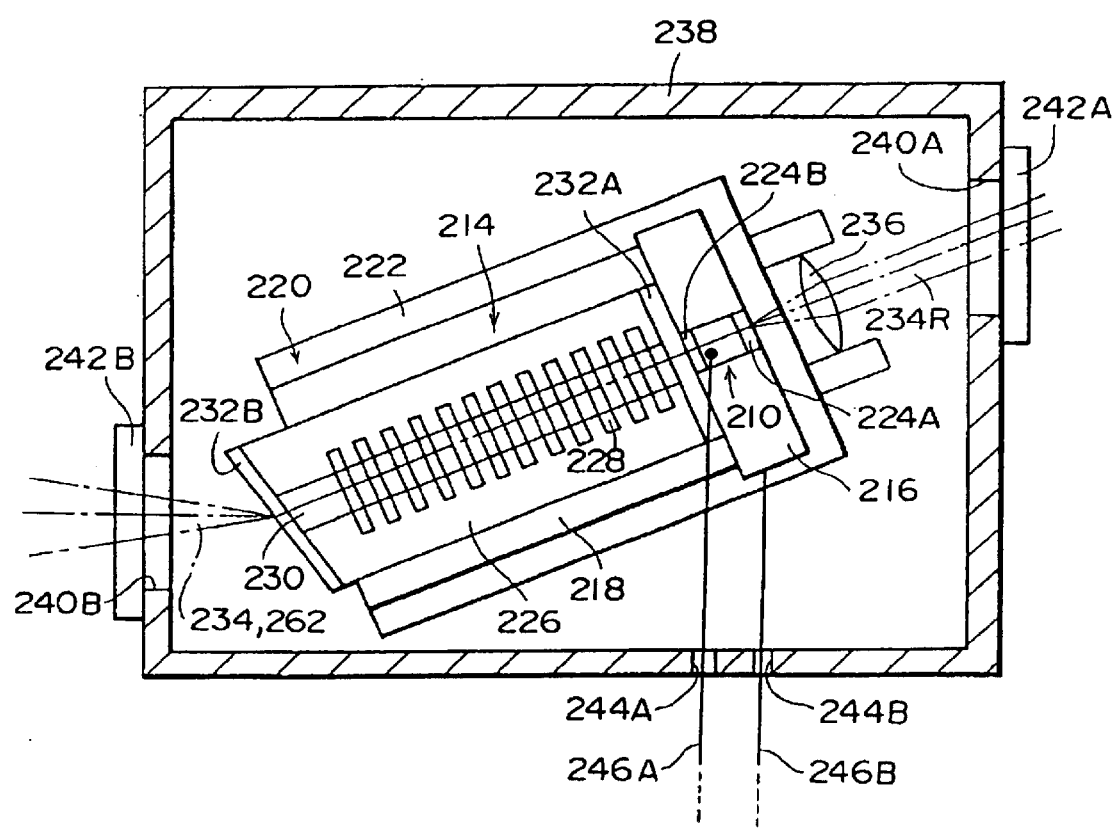
FIG. 23 is a plan view of the LD-SHG unit after being hermetically sealed in a package.

As shown in FIG. 23, a collimator lens 236 is attached to the LD-SHG unit 220. The laser beam (backward emitting light) 234R which emits, in a state of a divergent light, from the backward emitting end surface of the semiconductor laser 210 is made parallel by the collimator lens 236. The LD-SHG unit 220 and the collimator lens 236 are hermetically sealed in a package 238 with an inert gas or a dry air such as a dry nitrogen, and fixed therein. Further, any of a distribution refractive index rod lens such as Selfoc (i.e., product name), non-spherical lens, and a spherical lens can be used.

On the package 238, are formed a window opening 240A through which the backward emitting light 234R from the semiconductor laser 210 transmits and a window opening 240B through which a forward emitting light 262 from the light wavelength converting element 214 transmits. Transparent window plates 242A and 242B are adhered to the window openings 240A and 240B, respectively, to maintain a hermetic sealing state of the package 238. On the package 238, are also formed wire taking-out portions 244A and 244B in which low melting point glasses or the like are fitted into wire taking-out openings in the hermetic sealing state and through which two wires 246A and 246B which are connected to both electrodes of the semiconductor laser 210 are passed and then pulled out.

As shown in FIG. 26, the package 238, and a mirror 212, are fixed to a substrate 248 in a state in which the LD-SHG unit 220 and the collimator lens 236 are hermetically sealed.

Figure 30A:
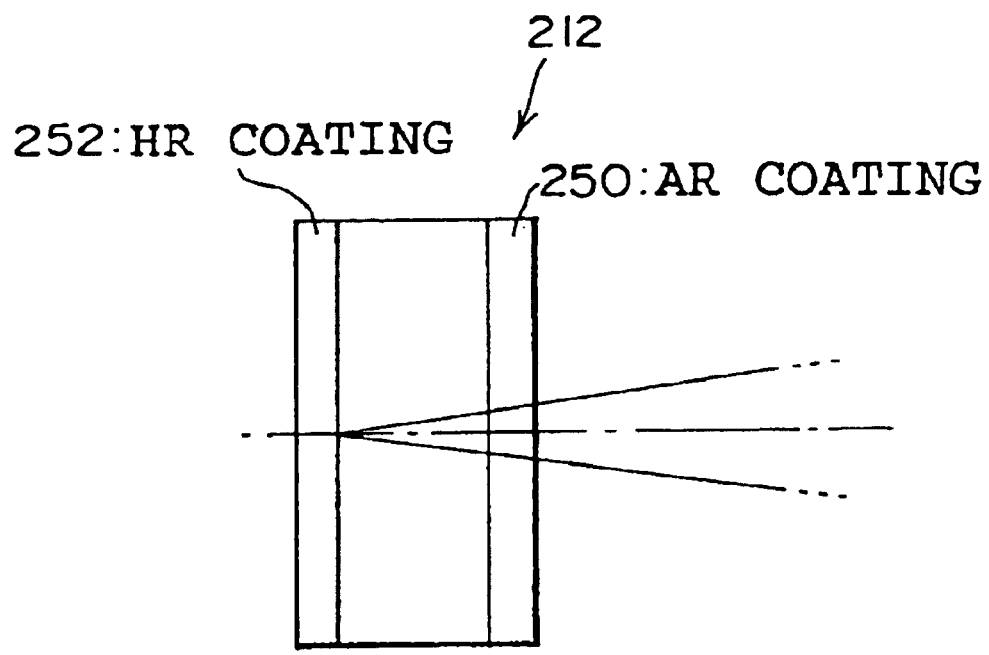
FIG. 30A is a partially enlarged view of a mirror which is used for the light wavelength converting module and which has an AR coated surface.

As shown in FIG. 26 and FIG. 30A, an AR coating 250 is applied to a surface at a laser beam incident side of a mirror 212, while an HR coating 252 is applied to a surface opposing the surface at the laser beam incident side thereof. Between the window plate 242A and the mirror 212 of the package 238, a narrow band-pass filter 256, as a wavelength selecting element, which is held by a holder 254 so as to be rotatable, a pair of total reflecting prisms 258A and 258B for turning the optical path of the laser beam 234R by about 180°, and a condenser lens 260 which converges the laser beam 234R which has been made parallel into the surface of the HR coating 252 of the mirror 212 are disposed in this order, and provided on the substrate 248. The reflectance of the HR coating 252 on the mirror 212 with respect to the fundamental wave is preferably 95%.

Figure 30B:
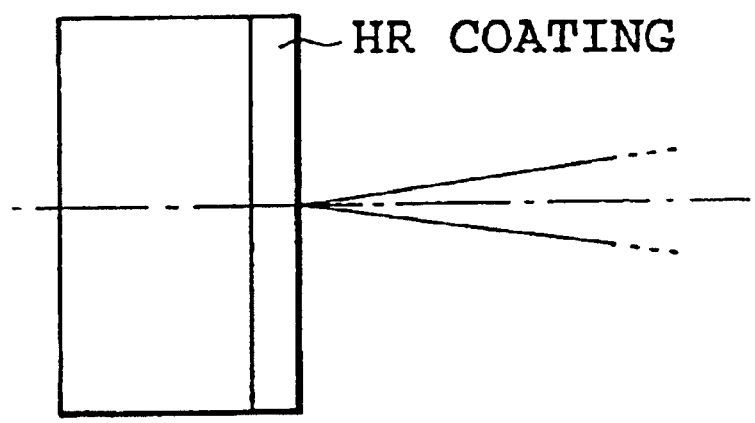
FIG. 30B is a partially enlarged view of a mirror which is used for the light wavelength converting module and which has an HR coated surface.

As the mirror 212, a mirror which is shown in FIG. 30B and in which the HR coating is applied on the laser beam incident side surface thereof can be used. In a case of this mirror, a laser beam is converged onto the surface of the mirror. However, it is generally known that the smaller a beam spot diameter, the larger a dust collecting effect. Since when the mirror which is shown in FIG. 30A is used to converge the laser beam onto the surface of the HR coating 252, the beam spot diameter on the mirror surface becomes larger than when the mirror which is shown in FIG. 30B is used to converge the laser beam onto the mirror surface, dust hardly deposits on the mirror surface. Accordingly, in such a device as in the present embodiment in which the mirror 212 is not hermetically sealed, as shown in FIG. 30A, by using a mirror in which the AR coating is applied onto the laser beam incident side surface of the mirror and the HR coating is applied to the surface opposing the laser beam incident side surface thereof, deterioration of the reflectance of the mirror due to the deposition of dust can be prevented.

The semiconductor laser 210 and the mirror 212 are disposed such that a resonator length of an external resonator which is formed by the mirror 212 and the forward emitting end surface of the semiconductor laser 210 (i.e., an optical length from the forward light emitting end surface of the semiconductor laser 210 to the HR coating 252 applied surface of the mirror 212) is larger than a coherent length of the fundamental wave which is emitted from the semiconductor laser 210. The coherent length Lc of the fundamental wave is a coherent distance intrinsic to the laser beam, and can be calculated in accordance with the following equation where a wavelength of the laser beam is $\lambda$, and a spectral width thereof is $\Delta\lambda$. Since the coherent length L of the fundamental wave is generally about 100 mm, the resonator length of the external resonator can be more than 100 mm, for example.

$$Lc=\lambda^2/(2\pi n\Delta\lambda)$$

Further, at the external side of the window plate 242B of the package 238, there are disposed and fixed onto the substrate 248, the collimator lens 264 which makes parallel a second harmonic 262 (including the fundamental wave 234) which emits from the forward light emitting end surface of the light wavelength converting element 214, an IR (infrared rays) cutting filter 266 which removes infrared ray components from the second harmonic 262 which has been made parallel, a half mirror 268, and a photodiode 270. As the collimator lens 264, a non-spherical lens having small aberration is preferably used.

Figure 27:
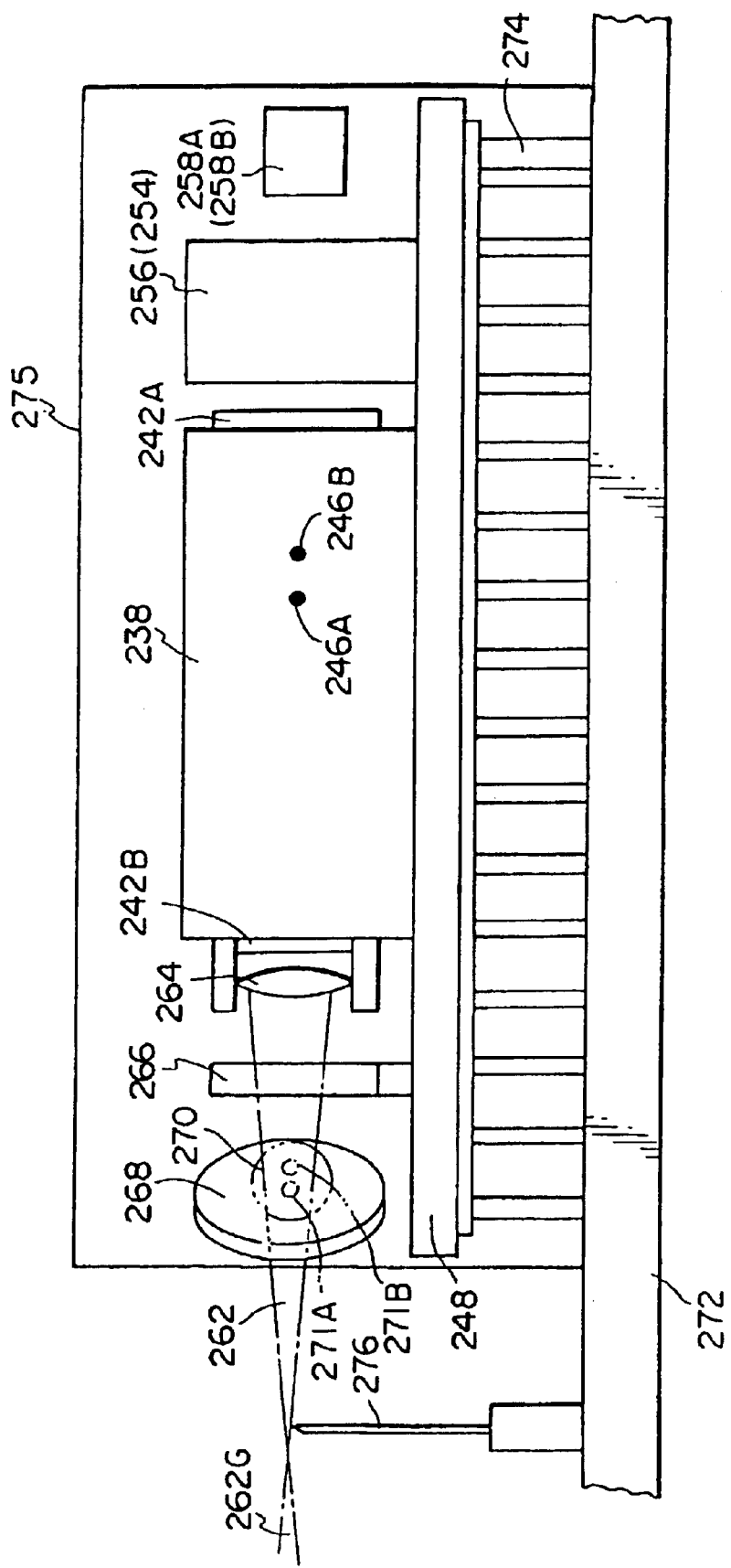
FIG. 27 is a cross-sectional view of the light wavelength converting module according to the tenth embodiment of the present invention.

As shown in FIG. 27, the substrate 248 is fixed to a mounting platform 272. Peltier elements 274 are placed between the substrate 248 and the mounting platform 272 to thereby control each of the optical elements fixed to the substrate 248 to a predetermined temperature. Each optical element fixed to the substrate 248, and the substrate 248 and the Peltier elements 274, are covered with a dustproof cover 275 whose laser beam emitting portion is clear.

A knife edge 276 as a beam shaping shielding plate is fixed and disposed in the vicinity of a position on the mounting platform 272 at which the second harmonic 262 converges. As will be described later, the second harmonic 262 which is emitted after having propagated a channel optical waveguide 230 of the light wavelength converting element 214 in a primary mode, has a side lobe at a lower portion perpendicular to the surface of the mounting platform 272 (i.e., in a thickness direction of the substrate 248). However, the knife edge 276 is disposed so as to cut a portion of this side lobe. The side lobe is cut by the knife edge 276, thus obtaining a second harmonic 262G, which can exhibit a Gaussian beam in which a light intensity distribution within a beam cross section is substantially a Gaussian distribution. Moreover, in the present embodiment, although the knife edge 276 is provided in the vicinity of the second harmonic 262 converging position, it can be kept in close contact with or can be provided adjacent to the forward light emitting end surface of the light wavelength converting element 214.

Figure 28:
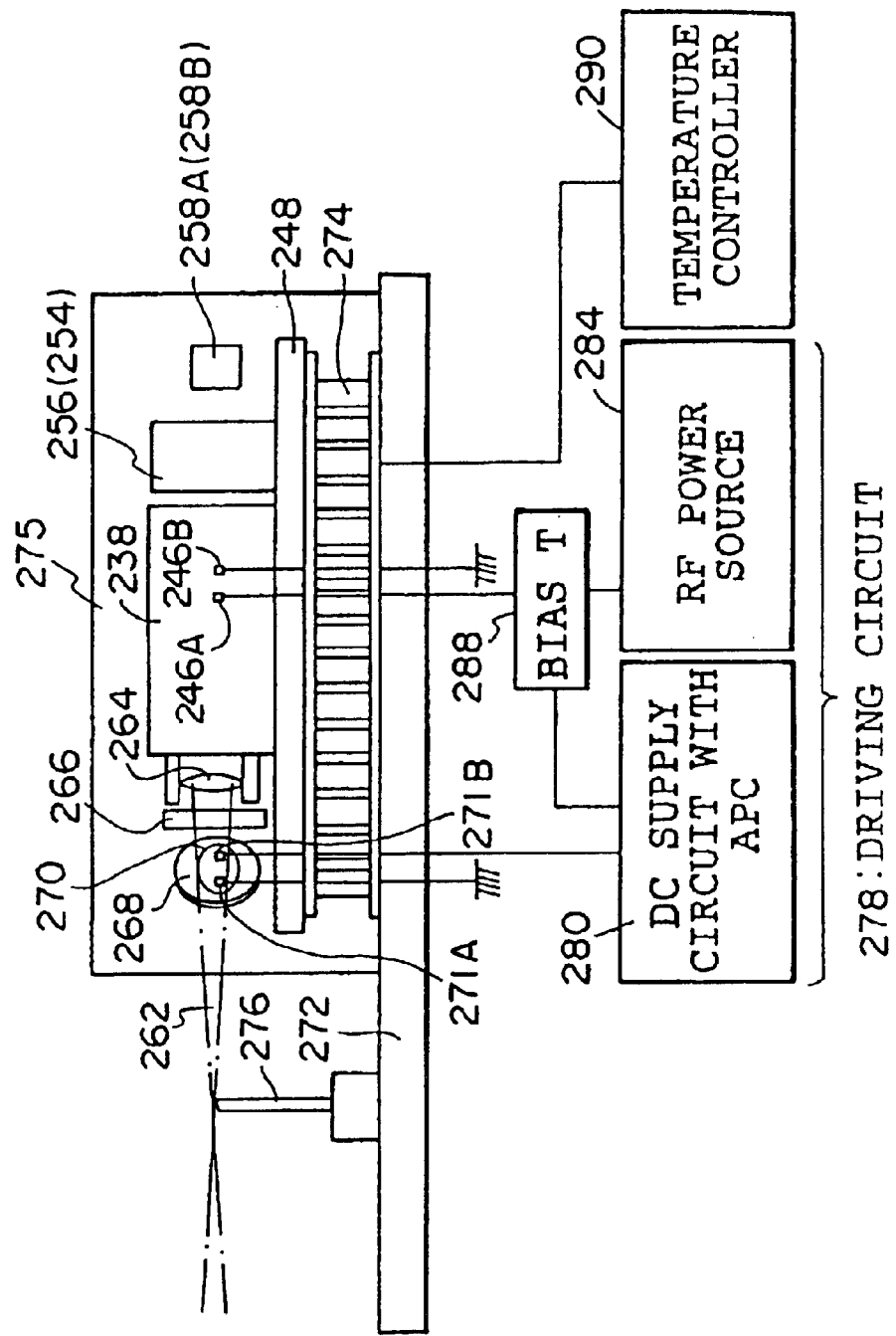
FIG. 28 is an explanatory view illustrating a wiring of the light wavelength converting module according to the tenth embodiment of the present invention.
Figure 29:
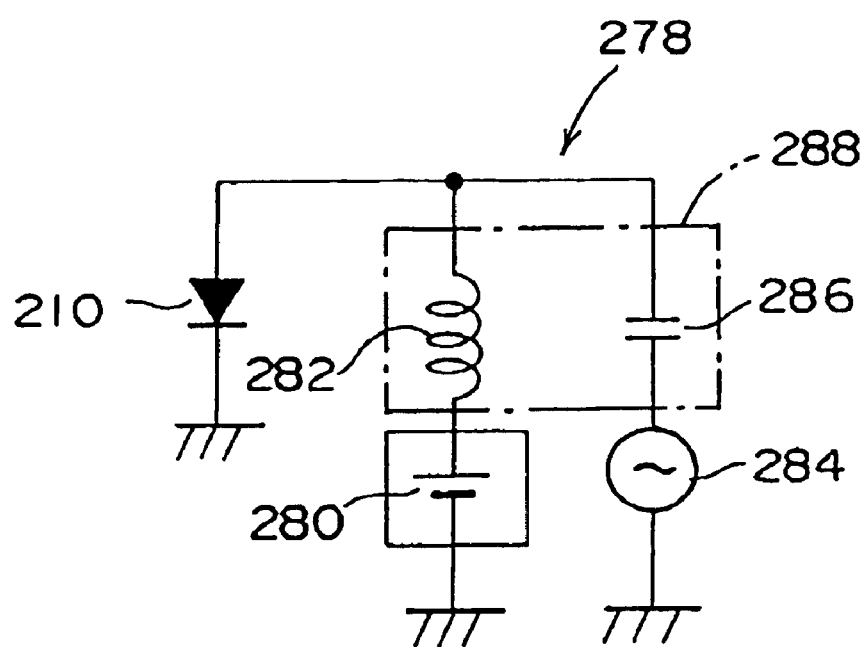
FIG. 29 is a circuit diagram of a driving circuit of the light wavelength converting module according to the tenth embodiment of the present invention.

As shown in FIG. 28, the semiconductor laser 210 is connected to a driving circuit 278 via the wires 246A and 246B which are pulled out from the dustproof cover 275. A schematic structure of the driving circuit 278 is shown in FIG. 29. This driving circuit 278 is formed by a DC power source circuit 280 having an automatic power control circuit (APC), an AC power source 284, and a bias T 288 which is formed by a coil 282 and a capacitor 286. High frequency current which is transmitted from the AC power source 284 through the capacitor 286 is superposed on a DC power source component which is transmitted from the DC power source circuit 280 through the coil 282, and the current on which the high frequency current has been superposed is applied to the semiconductor laser 210. In order to reduce noise output from the second harmonic, the frequency of the high frequency current which is superposed on the current is preferably 100 to 400 MHz, and the degree of modulation is preferably 100%.

Two wires 271A and 271B are connected to both electrodes of the photodiode 270 and are pulled out from the dustproof cover 275. The photodiode 270 is connected to the DC power source circuit 280 having the APC through the wires 271A and 271B which are pulled out from the dustproof cover 275. The amount of current to be applied to the semiconductor laser 210 is controlled by the APC to obtain a predetermined value output from the second harmonic 262. Further, the Peltier element 274 is connected to a temperature controller 290. Moreover, at the inside of the device which is covered with the dustproof cover 275, there is provided a thermister (not shown) which is connected to the temperature controller 290 and which controls the internal temperature of the device. The temperature controller 290 controls the Peltier element 274 on the basis of an output from the thermister to maintain the internal temperature of the device at a range of temperature that prevents a moisture condensation of the optical system under a working atmosphere (for example, 30° C. or more when a working atmosphere temperature is 30° C.).

A manufacturing method of the light wavelength converting module will be explained hereinafter.

As shown in FIG. 21, the semiconductor laser 210 is fixed to the mount 216 for a semiconductor laser by using adhesive or soldering while the light wavelength converting element 214 is fixed to the mount 216 for a semiconductor laser by using adhesive or soldering. Cu or SUS 304 is used as a material for the mount. The semiconductor laser 210 and the light wavelength converting element 214, in a state of being held by the mounts 216 and 218, are aligned to each other such that the emitting portion of the semiconductor laser 210 and the waveguide portion (incident portion) of the light wavelength converting element 214 correspond to each other thus manufacturing the LD-SHG unit 220.

As shown in FIG. 22, the LD-SHG unit 220 is fixed onto a substrate 222 by using adhesive or YAG welding. As shown in FIG. 23, the collimator lens 236, which is mounted to the LD-SHG unit 220, is fixed in the package 238. Further, when Cu which has a high thermal conductivity is used for the mount 216 for the semiconductor laser, the semiconductor laser 210 is not heated, and preferably, adhesive is used to fix the semiconductor laser 210 in the package 238. After the two wires 246A and 246B which are connected to both of the electrodes of the semiconductor laser 210 have been pulled out from the wire taking-out portions 244A and 244B provided at the package 238, the inside portion of the package 238 is filled with an inert gas such as a dry nitrogen or a dry air to thereby close the opening portion of the package 238 by an electric welding or a seam welding.

Figure 24:
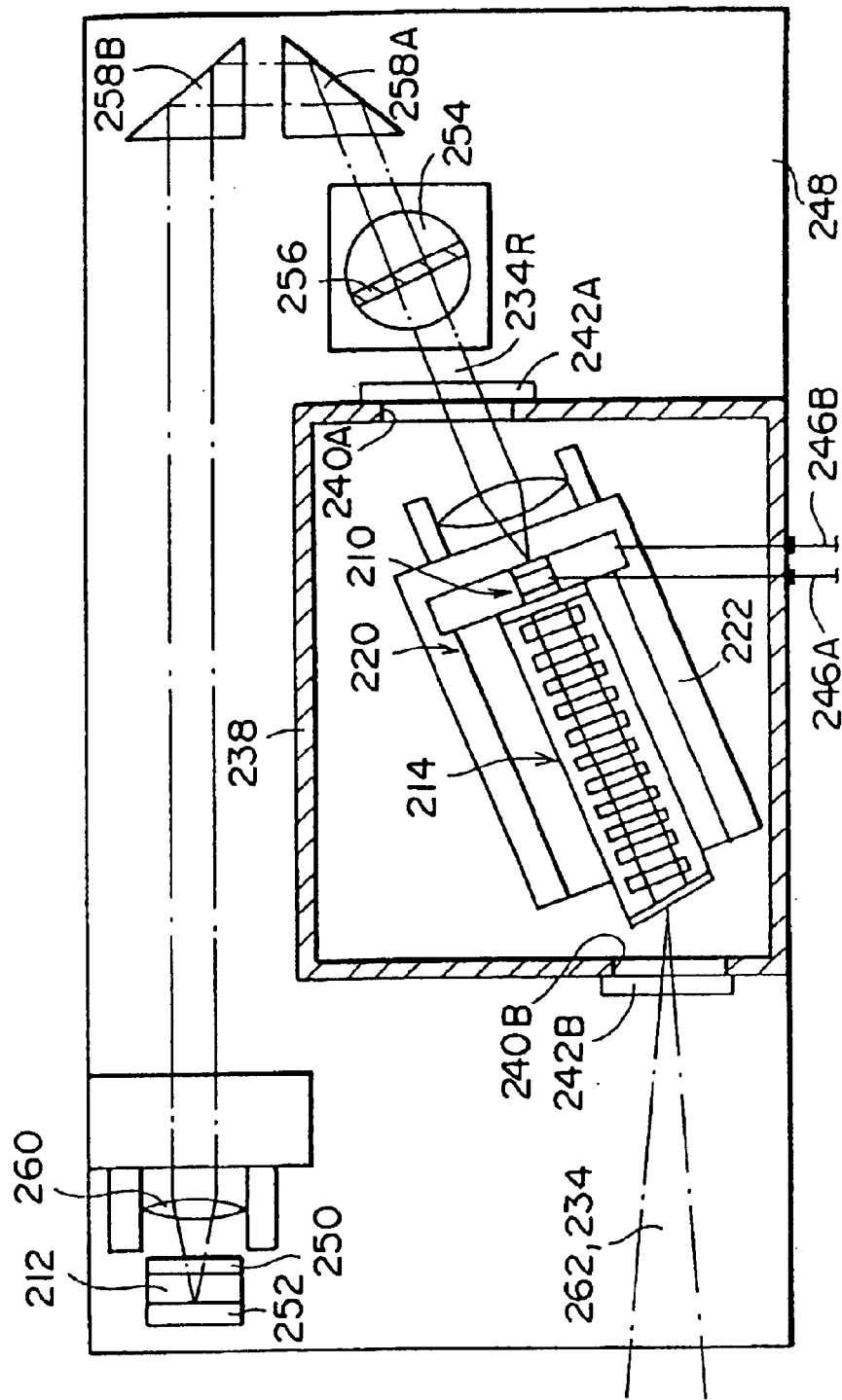
FIG. 24 is a plan view illustrating a manufacturing process of the light wavelength converting module according to the tenth embodiment of the present invention.
Figure 25:
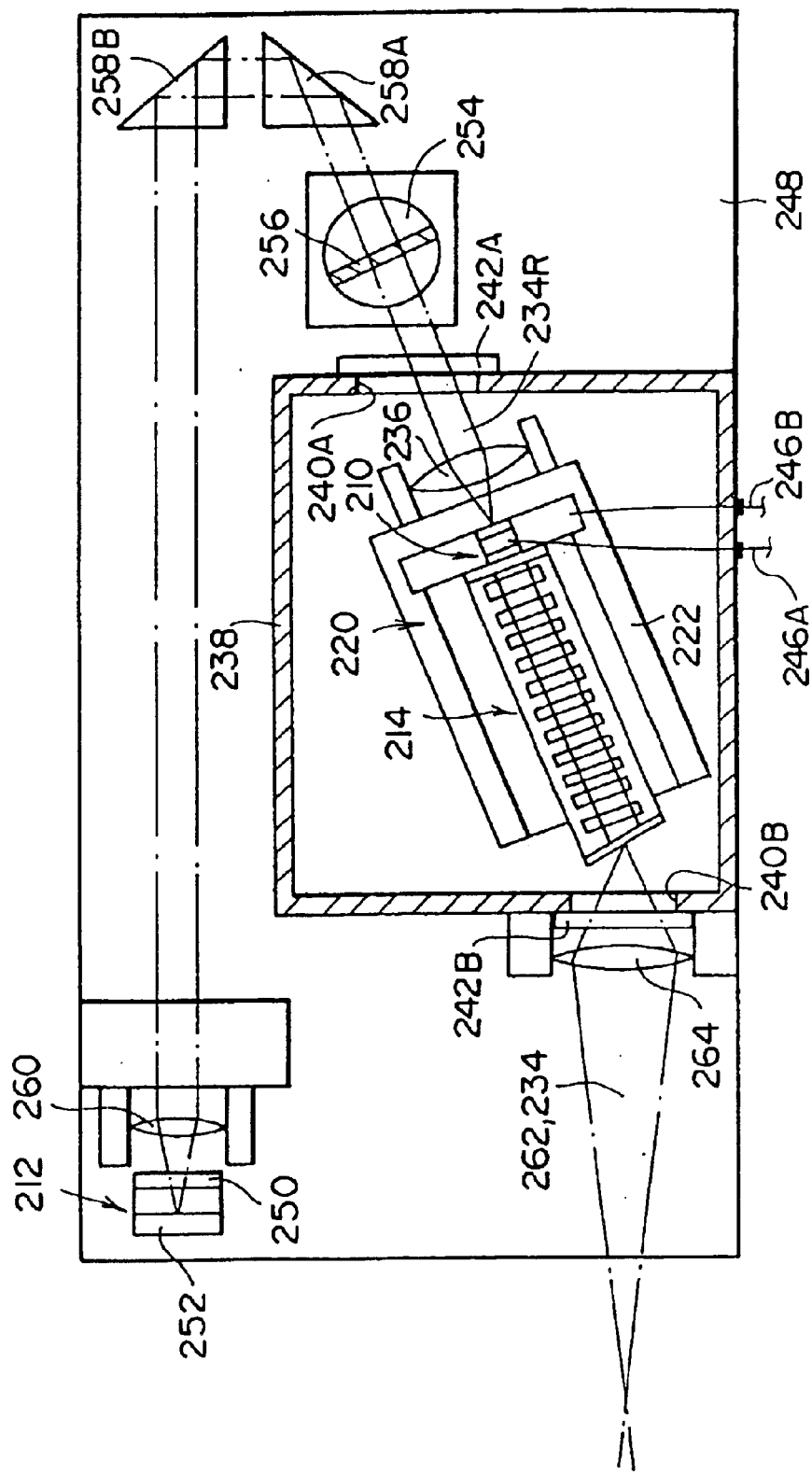
FIG. 25 is a plan view illustrating the manufacturing process of the light wavelength converting module according to the tenth embodiment of the present invention.

As shown in FIG. 24, after this package 238 has been fixed onto the substrate 248, the mirror 212, the narrow band-pass filter 256, the pair of the total reflection prisms 258A and 258B, and the condenser lens 260 are fixed onto the substrate 248. In order to obtain a maximum light output from the light wavelength converting element 214, each of these optical elements is disposed while adjusting an oscillating wavelength of the semiconductor laser 210.

As shown in FIG. 27, the substrate 248 having each of the optical elements fixed thereon is mounted to the Peltier element 274, and then fixed to the mount platform 272. Each of the optical elements, and the substrate 248 and the Peltier element 274 are covered with the dustproof 275. Further, the knife edge 276 as the beam shaping shielding plate is fixed and disposed in the vicinity of a position on the mounting platform 272 at which the second harmonic 262 converges.

Lastly, wiring is carried out as shown in FIG. 28. The semiconductor laser 210 is connected to the driving circuit 278. The photodiode 270 is connected to the DC power source circuit 280 of the driving circuit 278. The Peltier elements 274 and the thermister are connected to the temperature controller 290. As a result, the light wavelength converting module is completed.

An operation of this light wavelength converting module will be explained hereinafter.

As shown in FIG. 24, the laser beam 234R (backward emitting light) which emits not forwardly but backwardly from the semiconductor laser 210 is made parallel by the collimator lens 236. After the laser beam 234R which was made parallel has transmitted through the narrow band-pass filter 256, the optical path thereof is returned by about 180° by the pair of the total reflecting prisms 258A and 258B, converged by the condenser lens 260, and then focused on the mirror 212. The laser beam 234R which is reflected from the mirror 212 is fed back to the semiconductor laser 210 by tracking in the opposite direction of the current optical path. Namely, in this device, the external resonator of the semiconductor laser 210 is formed by the mirror 212 and the semiconductor laser 210.

The narrow band-pass filter 256 which is disposed inside the external resonator selects a wavelength of the laser beam 234R which is supposed to be fed back. Since the semiconductor laser 210 oscillates with this selected wavelength which varies in accordance with a position at which the narrow band-pass filter 256 rotates, due to an appropriate rotation of the narrow band-pass filter 256, oscillating wavelengths of the semiconductor laser 210 can be selected and locked so as to correspond to cycles of the domain inverting portions 228 and to make a pseudo phase matching with the second harmonic 262 (see FIG. 21B).

On the other hand, the laser beam 234 which is locked at a predetermined wavelength and which emits forwardly from the semiconductor laser 210 enters the channel optical waveguide 230 (see FIG. 1B). The laser beam 234 is wave-guided through the channel optical waveguide 230 in the TE mode and makes a phase matching (so-called pseudo phase matching) in the periodic domain inversion region thereof. When the central wavelength of the laser beam 234 is 950 nm, for example, the wavelength of the laser beam 234 is reduced to ½, namely, it is converted to the second harmonic 262 of 475 nm. This second harmonic 262 also propagates the channel optical waveguide 230 in a waveguiding mode and emits from the optical waveguide end surface.

In accordance with various experiments conducted by the present inventors, the second harmonic which propagates a waveguide in a primary mode was turned out to have a larger overlap integral with a fundamental wave than that in a zero mode. Namely, making a phase matching of the second harmonic which propagates in the primary mode, and the fundamental wave can improve a wavelength conversion efficiency. For this reason, in the present embodiment, a cycle $\Lambda$ of the periodic domain inversion structure is set such that the second harmonic 262 which propagates the channel optical waveguide 230 of the light wavelength converting element 214 and the fundamental wave 234 make a pseudo phase matching. More specifically, when an effective refractive index of the optical waveguide with respect to the fundamental wave is $n\omega$, an effective refractive index thereof with respect to the second harmonic is $n2\omega$, and a wavelength of the fundamental wave is $\lambda F$, the cycle $\Lambda$ is determined to satisfy the following equation:

$$n2\omega - n\omega = \lambda F/2\Lambda$$

Further, the laser beam 234 whose wavelength has not been converted also emits from the optical waveguide end surface in the state of the divergent light. The second harmonic 262, and the laser beam 234 are made parallel by the collimator lens 264. Accordingly, light which emits from the optical waveguide end surface of the light wavelength converting element 214 is made parallel by the collimator lens 264, and thereafter, the second harmonic 262 is branched by the IR cutting filter 266 and then emitted. A portion of the emitted second harmonic 262 reflects from a half mirror 268 and is detected by the photodiode 270 to thereby control power of the laser beam.

Eleventh Embodiment

Figure 31:
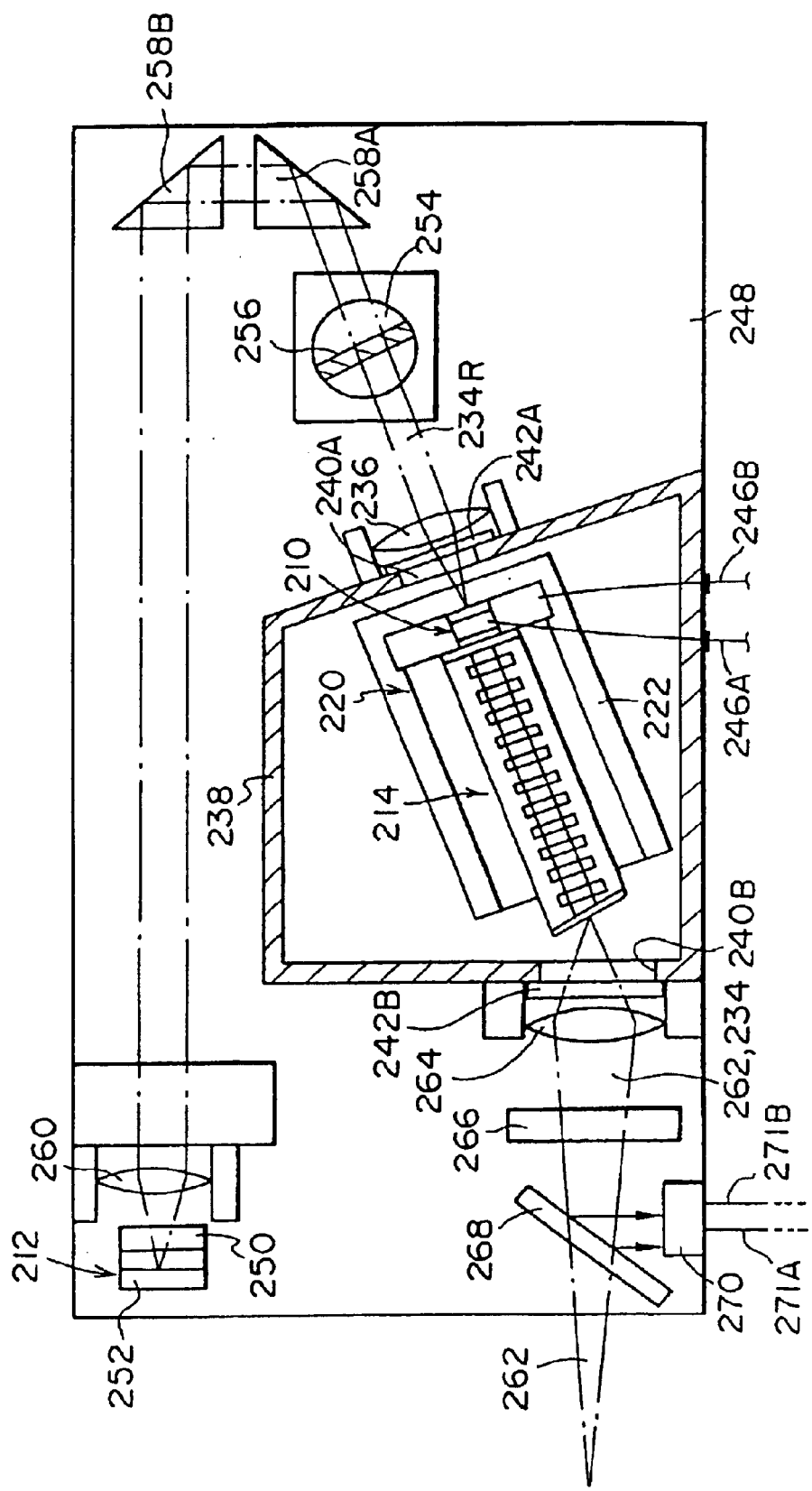
FIG. 31 is a plan view of a light wavelength converting module according to en eleventh embodiment of the present invention.

As shown in FIG. 31, a light wavelength converting module according to an eleventh embodiment of the present invention is structured in the same manner as that of the tenth embodiment of the present invention which is shown in FIGS. 26, 27, and 28 except that the LD-SHG unit 220 is hermetically sealed in the package 238, a lens having a large working distance is used as the collimator lens 236, and the collimator lens 236 is placed at an external portion of the package 238. Accordingly, portions identical to those shown in the previous embodiment are denoted by the same reference numerals, and a description thereof will be omitted.

The LD-SHG unit 220, and an inert gas such as a dry nitrogen or a dry air are hermetically sealed in the package 238 as a hermetic sealing member, and fixed therein. The package 238, and the mirror 212 are fixed onto the substrate 248 in a state in which the LD-SHG unit 220 is hermetically sealed. Between the window plate 242A and the mirror 212 of the package 238, the collimator lens 236 which makes parallel the backward emitting light 234R from the semiconductor laser 210, the narrow band-pass filter 256 as the wavelength selecting element which is held by the holder 254 so as to be rotatable, the pair of the total reflecting prisms 258A and 258B for turning the optical path of the laser beam 234R by about 180°, and the condenser lens 260 which converges the laser beam 234R which has been made parallel on a surface of the mirror 212 applied by the HR coating 252 are disposed in this order and provided on the substrate 248. Further, any of the distribution refractive index rod lens such as Cellfoc (product name), the non-spherical lens, and the spherical lens can be used.

Figure 32:
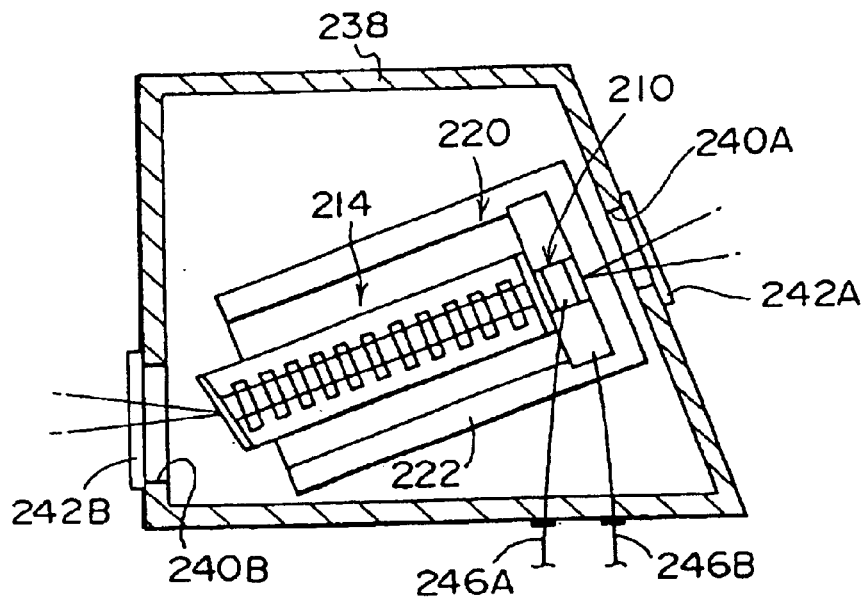
FIG. 32 is a plan view illustrating a manufacturing process of the light wavelength converting module according to the eleventh embodiment of the present invention.
Figure 33:
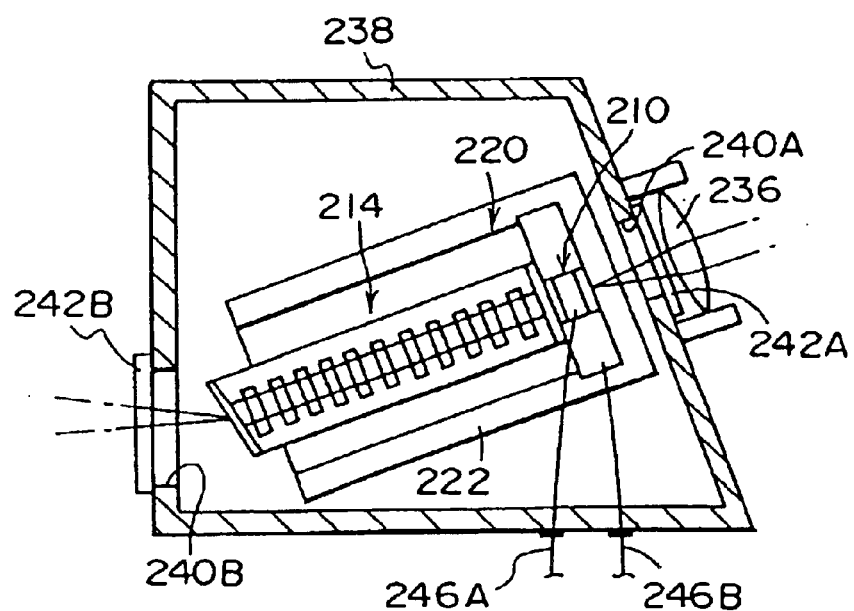
FIG. 33 is a plan view illustrating the manufacturing process of the light wavelength converting module according to the eleventh embodiment of the present invention.

The light wavelength converting module can be prepared in the same manner as the tenth embodiment of the present invention except that, as shown in FIG. 32, the LD-SHG unit 220 which is mounted on the substrate 248 through the adhesive or the YAG welding is fixed in the package 238 is hermetically sealed, and as shown in FIG. 33, this package 238 is mounted on the substrate 248, and thereafter, the collimator lens 236, which is disposed at an external portion of the window plate 242A of the package 238, is mounted on the substrate 248.

Twelfth Embodiment

Figure 34:
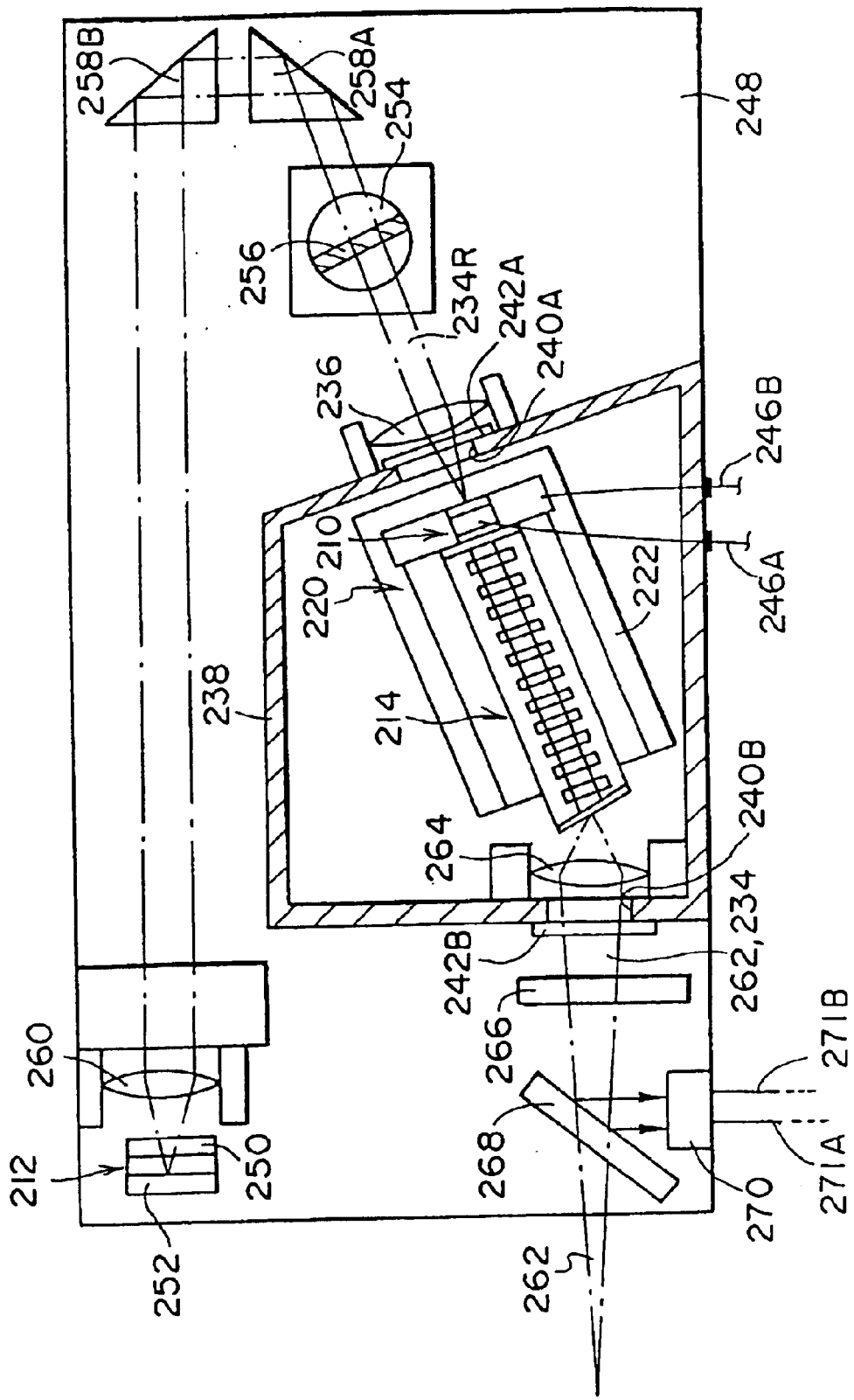
FIG. 34 is a plan view according to a twelfth embodiment of the present invention.

A light wavelength converting module according to a twelfth embodiment of the present invention is structured in the same manner as that of the eleventh embodiment of the present invention which is shown in FIG. 31 except that, as shown in FIG. 34, other than the LD-SHG unit 220, the collimator lens 264 which makes parallel the second harmonic 262 or the like which emits from the forward emitting end surface of the light wavelength converting element 214 is hermetically sealed in the package 238. Accordingly, portions identical to those shown in the previous embodiment are denoted by the same reference numerals, and a description thereof will be omitted.

The collimator lens 264 which makes parallel the second harmonic 262 (including the fundamental wave 234) which emits from the forward emitting end surface of the light wavelength converting element 214 is mounted to the LD-SHG unit 220. The collimator lens 264, and inert gas such as dry nitrogen or dry air are hermetically sealed in the package 238 as the hermetic sealing member, and fixed inside the package 238. As the collimator lens 264, a non-spherical lens having small aberration is preferably used.

In a state in which the LD-SHG unit 220 and the collimator lens 264 are hermetically sealed in the package 238, the package 238, and the mirror 212 are fixed onto the substrate 248. Outside the window plate 242B of the package 238, the IR (infrared rays) cutting filter 266 which removes infrared ray components from the second harmonic 262 which has been made parallel, a photodetector which is formed by the half mirror 268 and the photodiode 270 are provided, and fixed to the substrate 248.

This light wavelength converting module can be prepared in the same manner as that of the eleventh embodiment of the present invention except that the LD-SHG unit 220, which has been fixed onto the substrate 222 by using the adhesive or the WAG welding and to which the collimator lens 264 has been mounted, is fixed and then hermetically sealed in the package 238. Then, the package 238 is fixed onto the substrate 248.

Figure 35A:
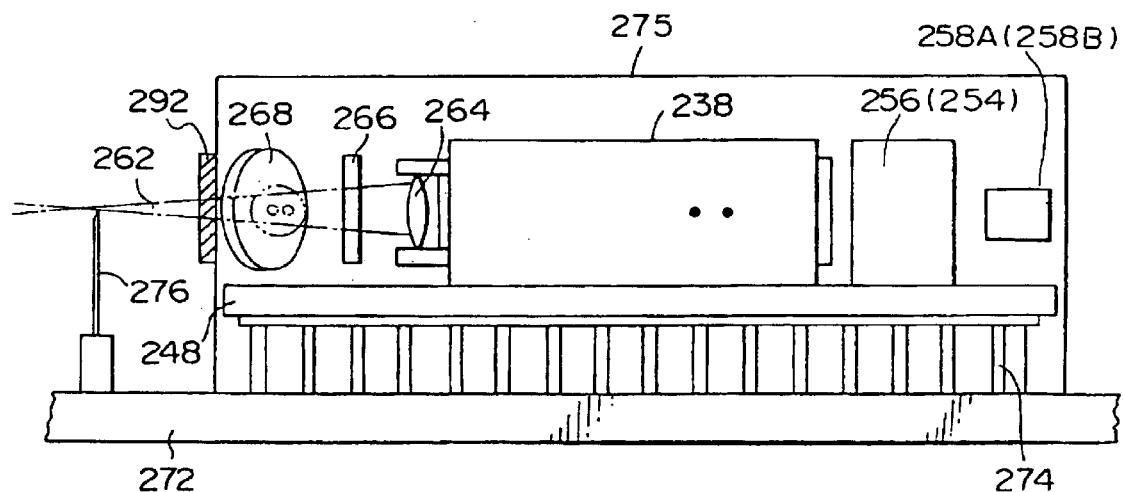
FIGS. 35A and 35B are plan views illustrating variant examples of the light wavelength converting module according to the tenth embodiment of the present invention.
Figure 35B:
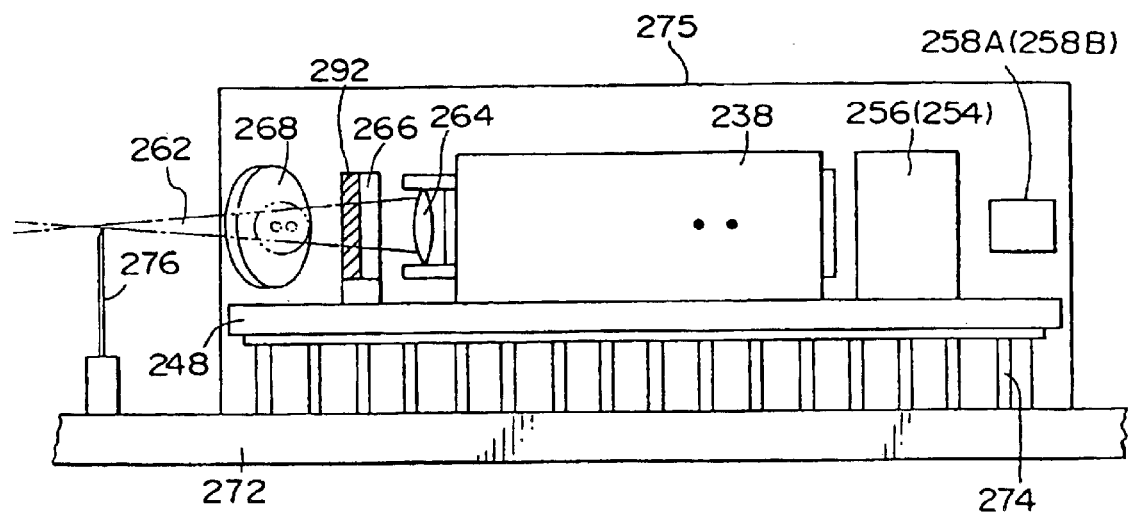
Figure 36:
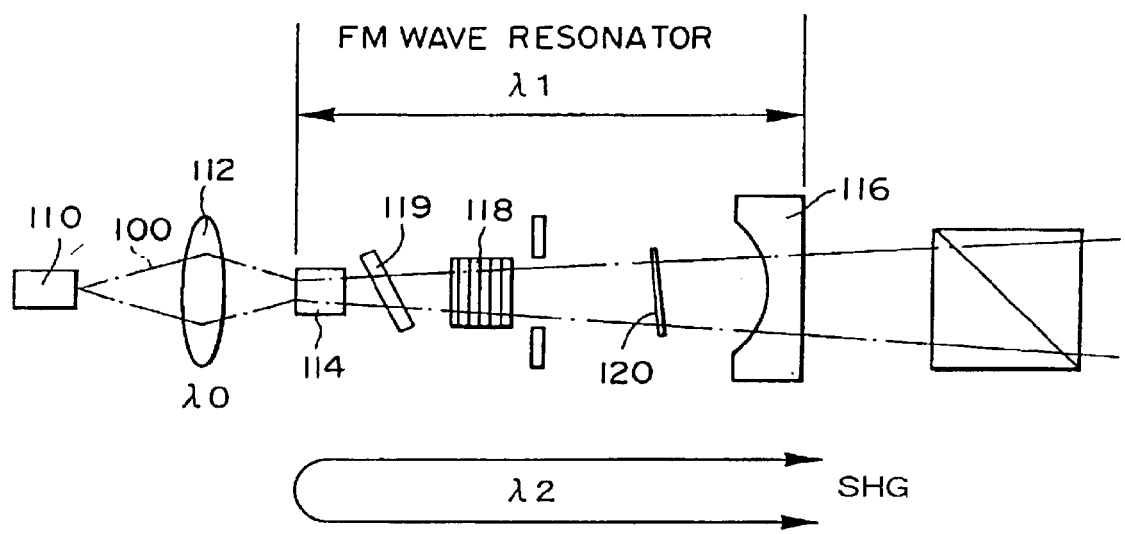
FIG. 36 is a schematic view illustrating a structure of a conventional excitation solid-state laser.

A polarization direction of the second harmonic which is obtained by the light wavelength converting module according to the tenth to twelfth embodiment of the present invention is parallel to a direction of the mounting platform 272. However, as shown in FIGS. 35A and 35B, a λ/2 plate 292 for controlling polarization can be used to obtain the second harmonic 262 which is polarized in a direction orthogonal to the mounting platform 272. For example, the λ/2 plate 292 can be mounted to an external side of the dustproof cover 275 which is provided on an optical path onto which the second harmonic emits or can be mounted on the IR cutting filter 266 in the longitudinal direction thereof, as shown in FIGS. 35A and 35B, respectively.

As described above, in the light wavelength converting module according to the tenth to twelfth embodiments of the present invention, because the semiconductor laser and the light wavelength converting element are connected directly to each other, use of a solid-state laser crystal becomes unnecessary so that the structure of the present module is simplified. Accordingly, a direct wavelength conversion of the fundamental wave which emits from the semiconductor laser can be carried out by using the light wavelength converting element. As a result, the degree of freedom in selecting an oscillating wavelength is enhanced, thus enabling a rapid modulation.

Further, in the light wavelength converting module according to the tenth to twelfth embodiments of the present invention, by merely hermetically sealing a small number of components having the semiconductor laser and the light wavelength converting element in the package, the manufacturing of the module is facilitated. Since the number of components to be hermetically sealed is small, deterioration of the sealed components over time due to gasses which are generated from the respective components can be prevented.

Particularly, in the light wavelength converting element according to the eleventh embodiment of the present invention, since a connection unit in which the semiconductor laser and the light wavelength converting element are connected to each other is hermetically sealed in the package, the number of the components can be further reduced. On the other hand, in the light wavelength converting element according to the tenth to twelfth embodiments of the present invention, since the collimator lens is hermetically sealed in the package, when the collimator lens is mounted to the module or the like, alignment of the optical axes of the lens and the semiconductor laser or the light wavelength converting element becomes unnecessary.

Moreover, in the light wavelength converting module according to the tenth to twelfth embodiments of the present invention, since a mirror in which the AT coating is applied to the laser beam incident side surface of the mirror while the HR coating is applied to the surface opposing the laser beam incident side surface thereof is used, a beam spot diameter between the surfaces of the mirror becomes large, dust is not liable to deposit on the surfaces of mirror, and deterioration of the reflectance of the mirror due to the deposition of dust can be prevented.

In the external resonator-type semiconductor laser, light such as fed-back light which is fed back from the external resonator and which have different optical paths are synthesized and emitted. Since light having different optical paths interfere with each other, as the state in which light interferes with each other changes, linearity of IL characteristic may deteriorate. For example, by increasing the amount of a current to be applied to the semiconductor laser, heat is generated by the semiconductor laser itself so that the reflectance and the optical length are changed, and the oscillating wavelength of the semiconductor laser is thereby changed. Accordingly, due to such a change of the oscillating wavelength of the semiconductor laser, the state of the light interference is changed so that the linearity of IL characteristic deteriorates. However, in the light wavelength converting module according to the tenth to twelfth embodiments of the present invention, since a resonator length of the external resonator is made larger than the coherent length of the fundamental wave, the light interference due to the fed-back light is not caused so that the linearity of IL characteristic can be maintained. Namely, when the resonator length of the external resonator is made larger than the coherent length of the fundamental wave, a slight variation of the resonator length of the external resonator does not influence the oscillating wavelength of the semiconductor laser largely. Accordingly, by merely hermetically sealing a small number of the components including the semiconductor laser and the light wavelength converting element is hermetically sealed, the module of the present invention can output the converted wavelength wave stably in spite of changes in the humidity or atmospheric pressure in the environment in which the module is used.

Further, in the light wavelength converting module according to the tenth to twelfth embodiments of the present invention, since the external resonator is structured to turn the optical path, the light wavelength converting module can be made compact.

In the light wavelength converting module according to the same embodiments as described above, since the semiconductor laser in a transverse single mode is used, no problem of a transverse mode hop is caused.

In the light wavelength converting module according to the same embodiments as described above, since the second harmonic which is the Gaussian beam is obtained, a recording light can be focused on a smaller spot and can be used suitably as a recording light source of a light scanning recording device.

When the width of a transmission band of the wavelength selecting element is set larger than the Fabry-Perot distance between the wall opening surfaces of the semiconductor laser, the semiconductor laser oscillate in a plurality of vertical modes. In such a state, even when a driving current of the semiconductor laser is fixed, there is caused a phenomenon which is called "vertical mode competition" in which an electric power distribution rate to each vertical mode varies over time. However, in the light wavelength converting module according to the tenth to twelfth embodiments of the present invention, since the high frequency current is superposed on the driving current of the semiconductor laser to thereby modulate and drive the semiconductor laser, the driving current does not remain in a region where the vertical mode competition is caused, thus suppressing the vertical mode competition.

In this way, since the semiconductor laser and the light wavelength converting element are connected directly to each other, use of a solid-state laser crystal becomes unnecessary so that the present module can be structured simply. Accordingly, a wavelength conversion of the fundamental wave which emits from the semiconductor laser can be carried out directly by using the light wavelength converting element. As a result, the degree of freedom in selecting an oscillating wavelength is enhanced, thus enabling a rapid modulation.

Since only a small number of the components including the semiconductor laser and the light wavelength converting element is hermetically sealed by the hermetic sealing member, the manufacturing of the module is facilitated. Further, since the number of components which are hermetically sealed is small, an effect can be provided in that deterioration of the sealed components over time due to gasses which are generated from the respective components can be prevented.

The light wavelength converting module including the above-described light conversion unit can also provide the same effect.

By applying a light-passing coating onto the laser beam incident side surface of a reflecting member and applying a high reflectance coating onto the surface opposing the laser beam incident side surface, the beam spot diameter between the surfaces of the reflecting member becomes larger, as compared to a case in which the laser beam is made to converge to the surfaces of the reflecting member. Accordingly, effects are provided in that dust hardly deposits on the surfaces of the reflecting member, thus preventing deterioration of the reflectance of the reflecting member.

Since the resonator length of the external resonator is made to be larger than the coherent length of the fundamental wave, when the resonator length of the external resonator varies more or less, this variation does not influence the oscillating wavelength of the semiconductor laser largely. Accordingly, by merely hermetically sealing a small number of the components including the semiconductor laser and the light wavelength converting element, the module of the present invention can output the converted wavelength wave stably in spite of changes in humidity or atmospheric pressure of the environment in which the light wavelength converting module is used.

The light wavelength converting element according to the first to third embodiments of the present invention can be applied to the wavelength stabilized laser according to the fourth to ninth embodiments of the present invention. Further, as described in the tenth to twelfth embodiments of the present invention, the connection unit which connects the lens, the semiconductor laser, and the light wavelength converting element or the connection unit of the semiconductor laser and the light wavelength converting element can be hermetically sealed in the wavelength stabilized laser according to the fourth to ninth embodiments of the present invention.

The light wavelength converting element according to the first to third embodiments of the present invention can be applied to the wavelength stabilized laser according to the fourth to ninth embodiments of the present invention, and as described in the tenth to twelfth embodiments of the present invention, the connection unit which connects the lens, the semiconductor laser, and the light wavelength converting element or the connection unit of the semiconductor laser and the light wavelength converting element can be hermetically sealed in the wavelength stabilized laser according to the fourth to ninth embodiments of the present invention.

The light wavelength converting element which is hermetically sealed according to the tenth to twelfth embodiments of the present invention can be replaced by the light wavelength converting element according to the first to third embodiments of the present invention, or can be replaced by a conventional light wavelength converting element which can reduce the amount of the fed-back light or which is not provided with a function which reduces the influence due to a fed-back light. Further, according to the tenth to twelfth embodiments of the present invention, an example in which the resonator length is made longer than the coherent length has been described. However, the present invention is not limited to this.

What is claimed is:

1. A light wavelength converting element comprising:
   (a) a substrate having a nonlinear optical effect; and
   (b) an optical waveguide formed on the substrate, the optical waveguide having first and second end surfaces which oppose one another, with the second end surface inclined relative to a direction substantially orthogonal to the first end surface, the second end surface emitting a converted wavelength wave when a fundamental wave enters the first end surface.

2. A light wavelength converting element according to claim 1, wherein said second end surface is inclined at an angle of at least 3 degrees relative to said direction.

3. A light wavelength converting element according to claim 1, wherein said second end surface is inclined at an angle of at least 7 degrees relative to said direction.

4. A light wavelength converting element according to claim 1, further comprising a reflection prevention coating disposed on said second surface, the coating having a reflectance with respect to the fundamental wave entering the first end surface, of less than approximately 0.1%, wherein said second end surface is inclined at an angle of at least 3 degrees, and less than 7 degrees relative to said direction.

5. A light wavelength converting element according to claim 1, wherein the reflection prevention coating is $SiO_2$.

6. A light wavelength converting element according to claim 1, wherein the light wavelength converting element is for use with an external resonator-type semiconductor laser for producing a laser beam for use as the fundamental wave, the light wavelength converting element further comprising a module adapted for direct connection to said semiconductor laser.

7. A light wavelength converting element according to claim 1, further comprising a device which superposes high frequency current for driving said external resonator-type semiconductor laser.

8. A light wavelength converting system comprising:
   (a) a substrate having a nonlinear optical effect;
   (b) an optical waveguide formed on the substrate, the optical waveguide having first and second end surfaces, the second end surface emitting a converted wavelength wave when a fundamental wave enters the first end surface; and
   (c) a block of material having a refractive index substantially equal to the refractive index of said optical waveguide connected to said second end surface of said optical waveguide.

9. A light wavelength converting system comprising:
   (a) a substrate having a nonlinear optical effect;
   (b) an optical waveguide formed on the substrate, the optical waveguide having first and second end surfaces, the second end surface emitting a converted wavelength wave when a fundamental wave enters the first end surface; and
   (c) a phase modulation portion for modulating a phase of said fundamental wave.

10. A light wavelength converting system according to claim 9, wherein said phase modulation portion is provided between a position at which wavelength conversion occurs and said second end surface.

11. A wavelength stabilized laser, comprising:
    a semiconductor laser having a coherent length and a laser beam emitting end surface;
    a device which feeds a laser beam emitted from said semiconductor laser back to said semiconductor laser along a feed back path having an optical length greater than said coherent length; and
    a band-pass filter disposed between said device and said semiconductor laser, which substantially passes therethrough only light of predetermined wavelengths.

12. A wavelength stabilized laser according to claim 11, wherein said device which feeds said laser beam back to said semiconductor laser is a mirror.

13. A wavelength stabilized laser according to claim 11, wherein said device which feeds said laser beam back to said semiconductor laser is a converging element and an optical fiber, the optical fiber having both an incident end surface and a reflecting end surface, the incident end surface disposed for receiving converged laser light from the converging element.

14. A wavelength stabilized laser according to claim 11, further comprising a mirror disposed along the feed back path between said semiconductor laser and said device which feeds said laser beam back to said semiconductor laser.

15. A wavelength stabilized laser according to claim 11, further comprising a prism disposed in the feed back path between said semiconductor laser and said device which feeds said laser beam back to said semiconductor laser.

16. A wavelength stabilized laser according to claim 11, further comprising an optical material whose refractive index is greater than 1 and through which said laser beam passes, disposed between said semiconductor laser and said device which feeds said laser beam back to said semiconductor laser.

17. A wavelength stabilized laser according to claim 11, wherein high frequency current is superposed for driving said semiconductor laser.

18. A wavelength stabilized laser according to claim 11, having a light wavelength converting element which converts a laser beam emitted from said semiconductor laser to a second harmonic.

19. A wavelength stabilizing laser according to claim 11, wherein said semiconductor laser is directly connected to the light wavelength converting element, the wavelength converting element comprising:
(a) a substrate having a nonlinear optical effect; and
(b) an optical waveguide formed on the substrate, the optical waveguide having first and second end surfaces which oppose one another, with the second end surface inclined relative to a direction substantially orthogonal to the first end surface, the second end surface emitting a converted wavelength wave when a fundamental wave enters the first end surface.

20. A wavelength stabilized laser, comprising:
a semiconductor laser;
a device which feeds a laser beam emitted from said semiconductor laser back to said semiconductor laser; and
a band-pass filter disposed between said device and said semiconductor laser, which substantially passes therethrough only light of predetermined wavelengths,
wherein the optical length from a laser beam emitting end surface of the semiconductor laser to a position at which the laser beam is fed back is substantially 100 mm.

21. A light wavelength converting unit, comprising:
(a) a semiconductor laser having a reflecting member, and first and second surfaces, the laser when operated emitting a laser beam through the first end surface towards the reflecting member which forms an external resonator, and causes a laser beam to emanate as a fundamental wave from the second end surface;
(b) a light wavelength converting element connected directly to said second end surface of said semiconductor laser to convert a wavelength of the fundamental wave when emitted from said second end surface of said semiconductor laser;
(c) a connection unit directly connecting the laser to the converting element; and
(d) a hermetic sealing member hermetically sealing the connection unit directly connecting said semiconductor laser and said light wavelength converting element.

22. A light wavelength converting module comprising a reflecting member which forms an external resonator, and said light wavelength converting unit according to clam 21.

23. A light wavelength converting unit according to claim 22, wherein said reflecting member has an incident side surface and an opposing surface, with a light-passing coating film disposed on the incident side surface and a high reflectance coating film provided on said opposing surface.

24. A light wavelength converting module according to claim 22, wherein said fundamental wave has a coherent length and said external resonator has a resonator length greater than the coherent length of said fundamental wave.

25. A light wavelength converting unit according to claim 24, wherein
said light wavelength converting element comprises:
(a) a substrate having a nonlinear optical effect; and
(b) an optical waveguide formed on the substrate, the optical waveguide having first and second end surfaces which oppose one another, with the second end surface inclined relative to a direction substantially orthogonal to the first end surface, the second end surface emitting a converted wavelength wave when a fundamental wave enters the first end surface.

26. A light wavelength converting module according to claim 22, wherein high frequency current is superposed on an electric current for driving said semiconductor laser.

27. A light wavelength converting unit according to claim 21, wherein high frequency current is superposed on an electric current for driving said semiconductor laser.

28. A light wavelength converting unit according to claim 21, wherein
said light wavelength converting element comprises:
(a) a substrate having a nonlinear optical effect; and
(b) an optical waveguide formed on the substrate, the optical waveguide having first and second end surfaces which oppose one another, with the second end surface inclined relative to a direction substantially orthogonal to the first end surface, the second end surface emitting a converted wavelength wave when a fundamental wave enters the first end surface.

29. A light wavelength converting unit, comprising:
(a) a semiconductor laser having a reflecting member, and first and second surfaces, the laser when operated emitting a laser beam through the first end surface towards the reflecting member which forms an external resonator, and causes a laser beam to emanate as a fundamental wave from the second end surface;
(b) a light wavelength converting element connected directly to said second end surface of said semiconductor laser to convert a wavelength of the fundamental wave when emitted from said second end surface of said semiconductor laser;
(c) a lens disposed adjacent to at least one of said first end surface of said semiconductor laser and said emitting end surface of said light wavelength converting element,
(d) a connection unit directly connecting the lens to the semiconductor laser and the light wavelength converting element; and
(e) a hermetic sealing member hermetically sealing the connection unit directly connecting said lens to said semiconductor laser and said light wavelength converting element.

* * * * *

UNITED STATES PATENT AND TRADEMARK OFFICE
CERTIFICATE OF CORRECTION

PATENT NO. : 6,839,365 B1
DATED : January 4, 2005
INVENTOR(S) : Shinichiro Sonoda et al.

It is certified that error appears in the above-identified patent and that said Letters Patent is hereby corrected as shown below:

Title page,
Item [56], References Cited, please insert the following references:
-- U.S. PATENT DOCUMENTS
5,313,543  A  *  5/1994   Matsuda et al……………..385/122
5,610,760  A  *  3/1997   Drenten et al……………..359/332
5,684,623  A  *  11/1997 King, et al………………..359/346
5, 812,716  A  * 9/1998   King……………………...385/92
4,748,687       * 5/1988   Auracher et al…………...455/609
4,910,738          3/1990   Fujita et al………………..372/18

FOREIGN PATENT DOCUMENTS
JP            7-281226       10/1995      ……………..
JP            4-36732         2/1992        ……………..
EP           0 562 636      3/1997        ……………..
EP           0 560 179      5/1998        ……………..
JP           11-52442       2/1999        ……………..
EP           0 335 691      1/1995        ……………..
EP           0 516 263      12/1994      ……………..
EP           0 468 826      3/1994        ……………..
JP           10-12959       1/1998        ……………..
JP           11-249183     9/1999        ……………..

OTHER PUBLICATIONS
Patent Abstract of Japan, 04333834, Nov. 20, 1992. --

Signed and Sealed this

Second Day of August, 2005

JON W. DUDAS
*Director of the United States Patent and Trademark Office*